(12) United States Patent
Nakashiba

(10) Patent No.: US 6,278,487 B1
(45) Date of Patent: Aug. 21, 2001

(54) SOLID-STATE IMAGE SENSING DEVICE

(75) Inventor: Yasutaka Nakashiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/985,524

(22) Filed: Dec. 5, 1997

(30) Foreign Application Priority Data

Dec. 5, 1996 (JP) .................................. 8-325369

(51) Int. Cl.$^7$ .......................... H04N 3/14; H01L 27/148; H01L 31/00
(52) U.S. Cl. ...................... 348/314; 348/311; 348/320; 348/322; 348/299; 257/445; 257/229; 257/230; 257/242
(58) Field of Search ...................... 348/311, 320, 348/322, 314, 299; 257/445, 229, 230, 242

(56) References Cited

U.S. PATENT DOCUMENTS

| 5,563,432 | * | 10/1996 | Miura et al. | 257/291 |
| 5,693,967 | * | 12/1997 | Park et al. | 257/229 |

FOREIGN PATENT DOCUMENTS

| 60-244063 | 12/1985 | (JP) . |
| 62-154881 | 7/1987 | (JP) . |
| 1-204577 | 8/1989 | (JP) . |
| 2-205359 | 8/1990 | (JP) . |
| 4-371084 | 12/1992 | (JP) . |
| 6-334166 | 12/1994 | (JP) . |
| 9-223788 | 8/1997 | (JP) . |
| 9-307094 | 11/1997 | (JP) . |

* cited by examiner

Primary Examiner—Wendy R. Garber
Assistant Examiner—Rashawn N. Tillery
(74) Attorney, Agent, or Firm—Sughrue, Mion, Zinn, Macpeak & Seas, PLLC

(57) ABSTRACT

A solid-state image sensing device includes photoelectric conversion portions, vertical charge transfer portions, a horizontal charge transfer portion, an unwanted charge removing portion, and a potential barrier portion. The photoelectric conversion portions are arranged on an n-type semiconductor substrate. The vertical charge transfer portions are respectively arranged adjacent to the photoelectric conversion portions, and have a first p-type well layer and a first n-type semiconductor region. The horizontal charge transfer portion is arranged adjacent to one end side of the vertical charge transfer portions, and has a second p-type well layer and a second n-type semiconductor region. The unwanted charge removing portion is arranged adjacent to the horizontal charge transfer portion to remove an unwanted charge overflowing from the horizontal charge transfer portion. The unwanted charge removing portion has a third p-type well layer and a third n-type semiconductor region. The potential barrier portion is formed between the horizontal charge transfer portion and the unwanted charge removing portion. The first and third semiconductor regions are formed by the same step, and the second and third well layers are formed by the same step.

22 Claims, 23 Drawing Sheets

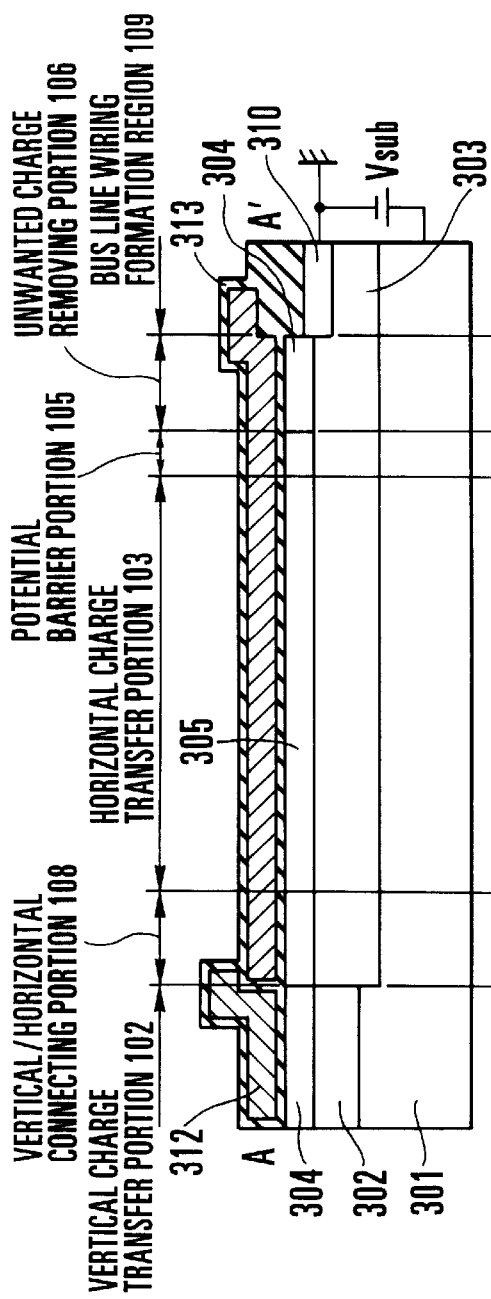
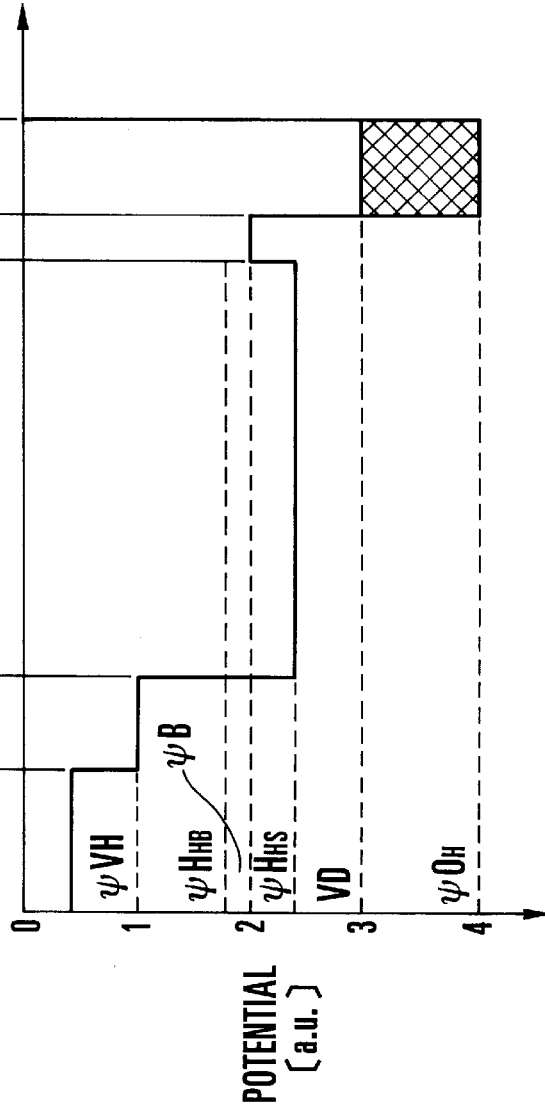
FIG. 3A
FIG. 3B

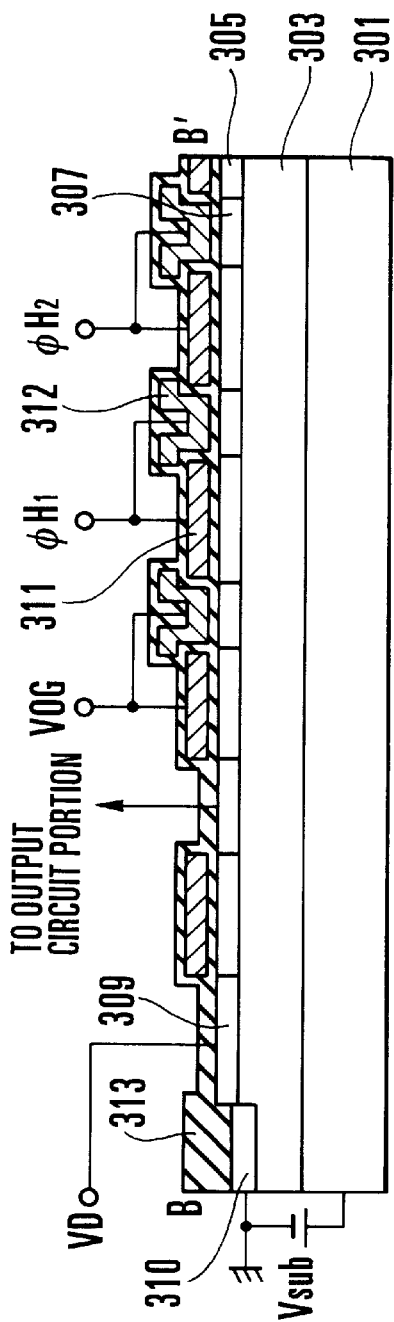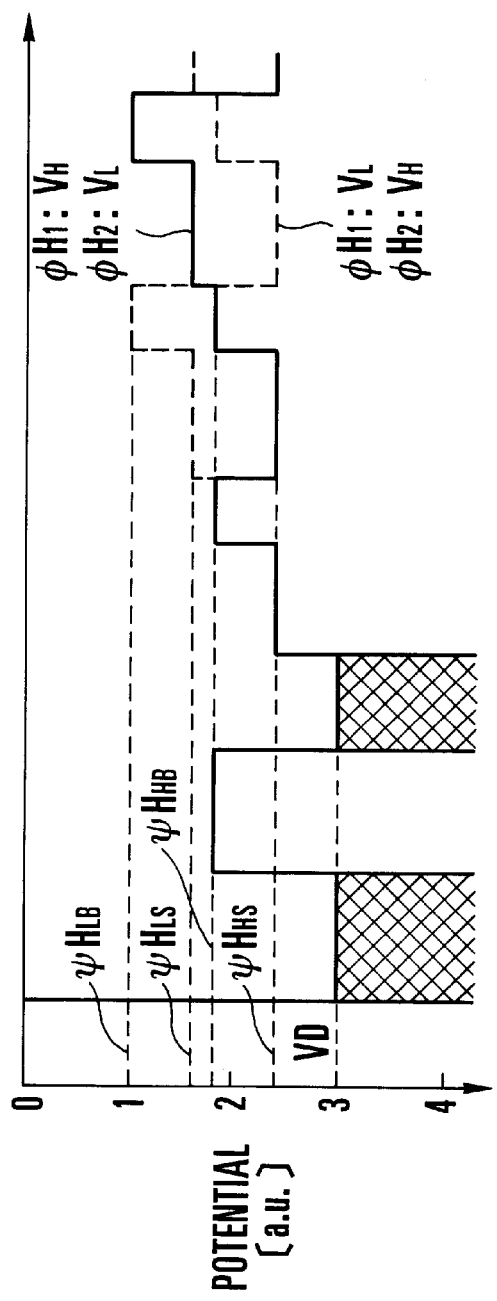
FIG. 4A
FIG. 4B

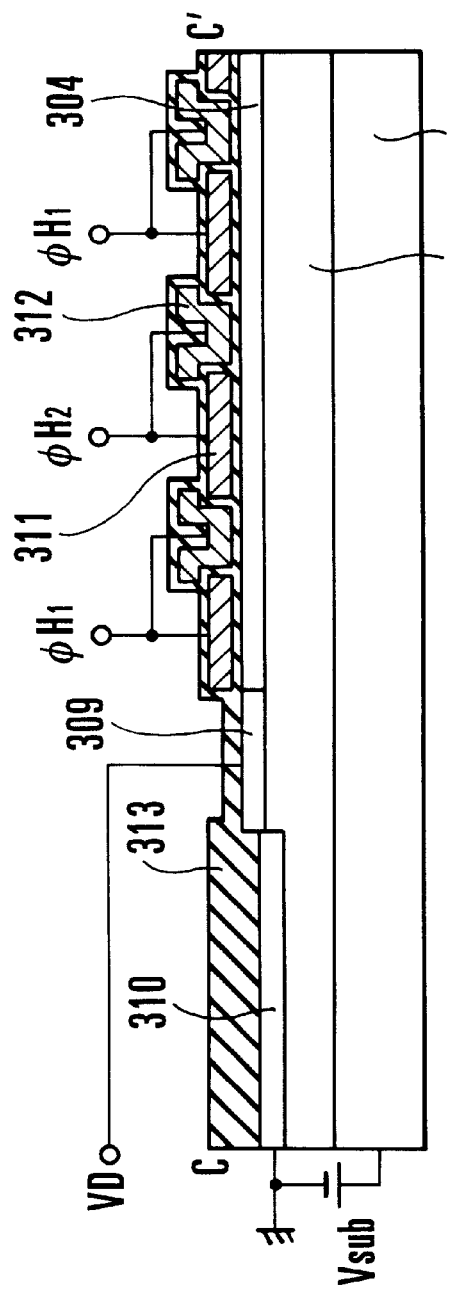
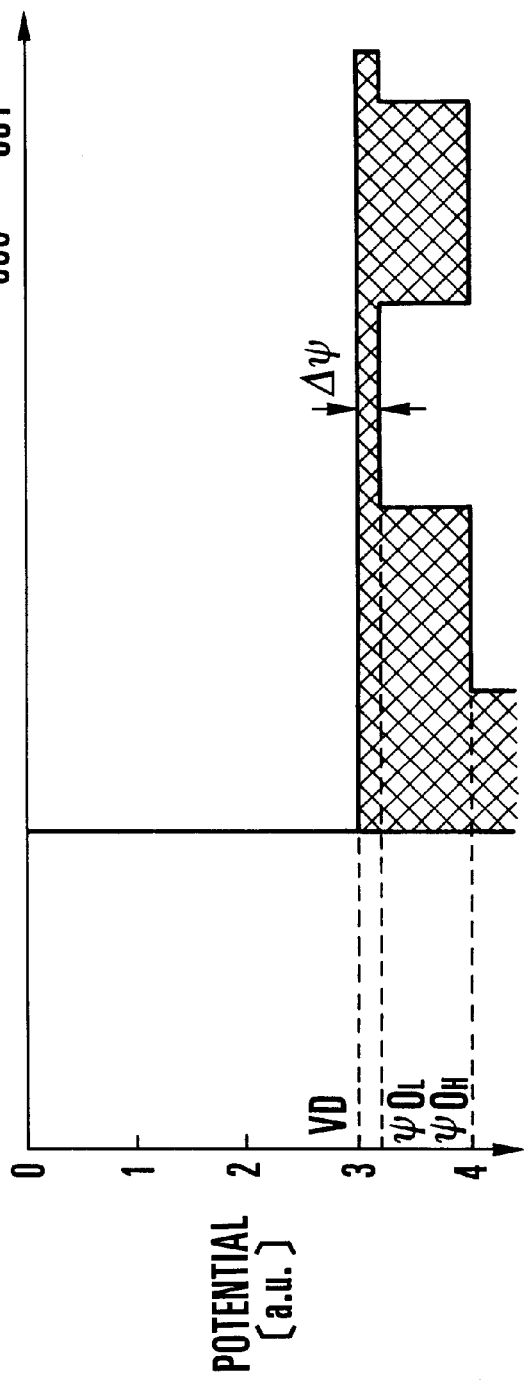
FIG. 5A
FIG. 5B

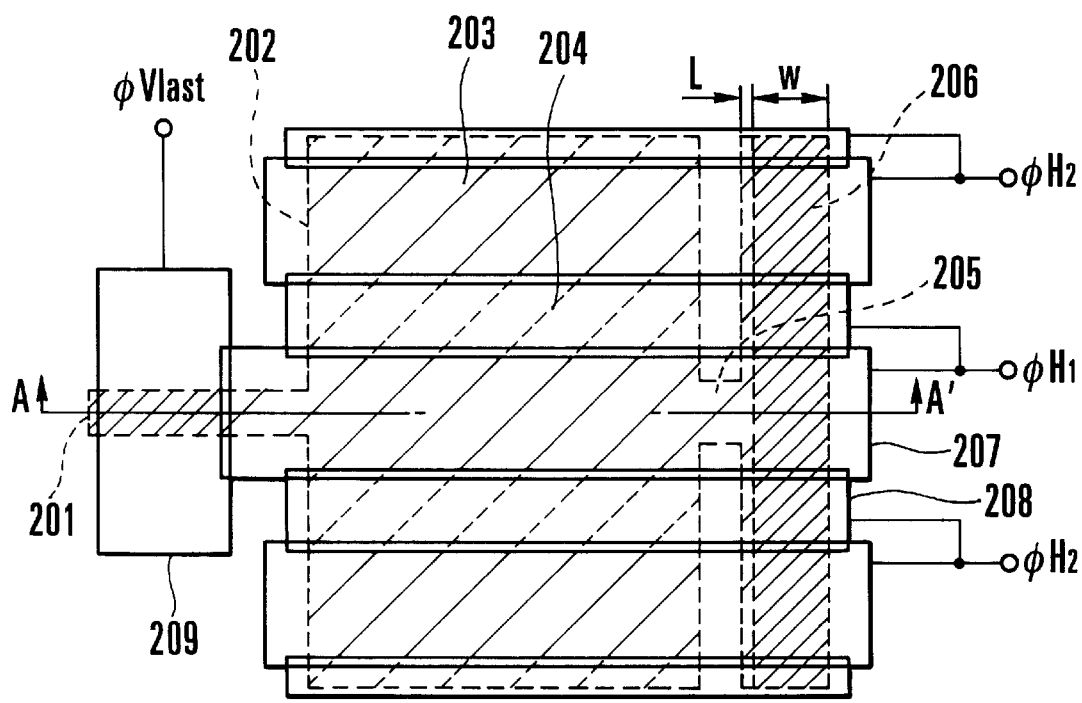
F I G. 7

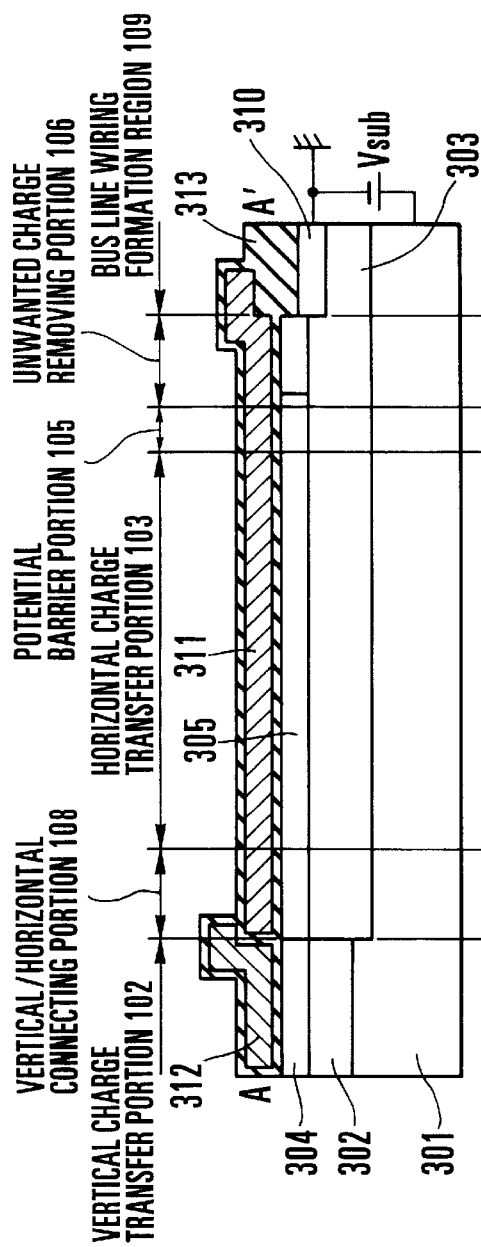
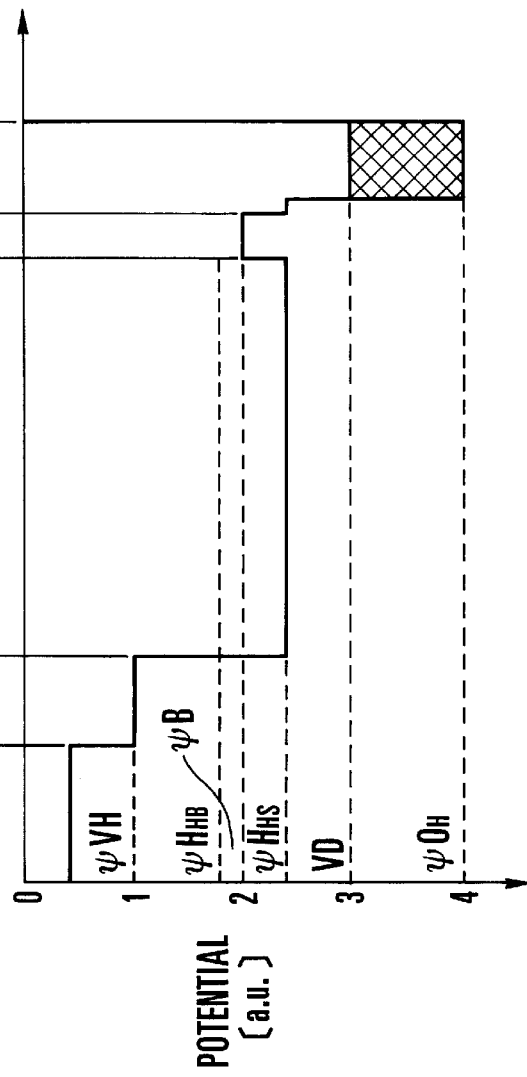
FIG. 8A
FIG. 8B

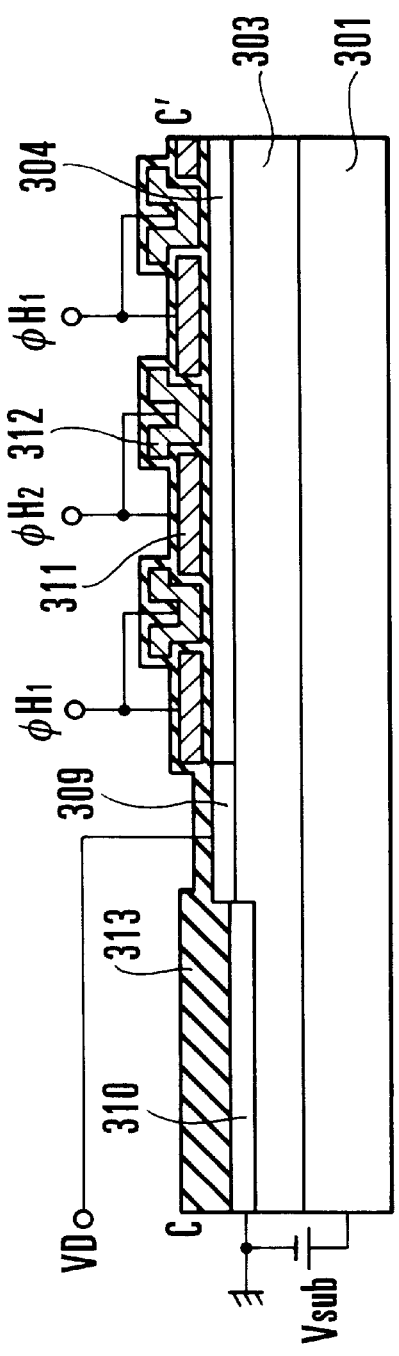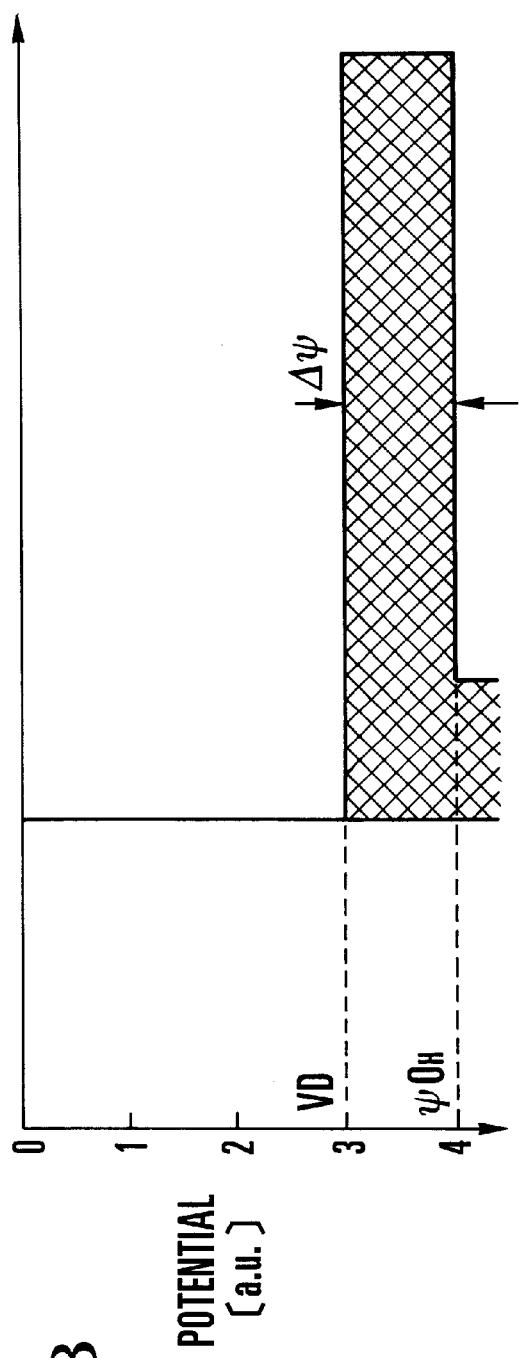
FIG. 9A
FIG. 9B

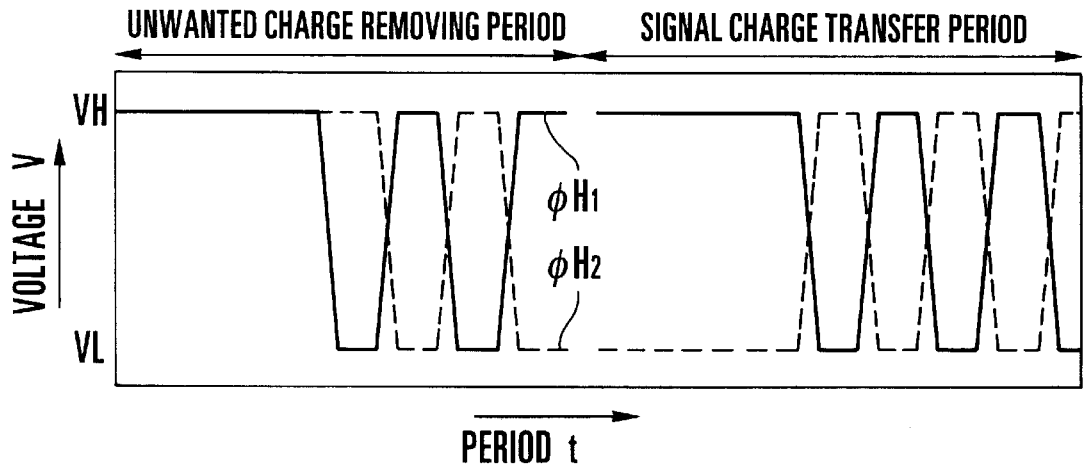
F I G. 10
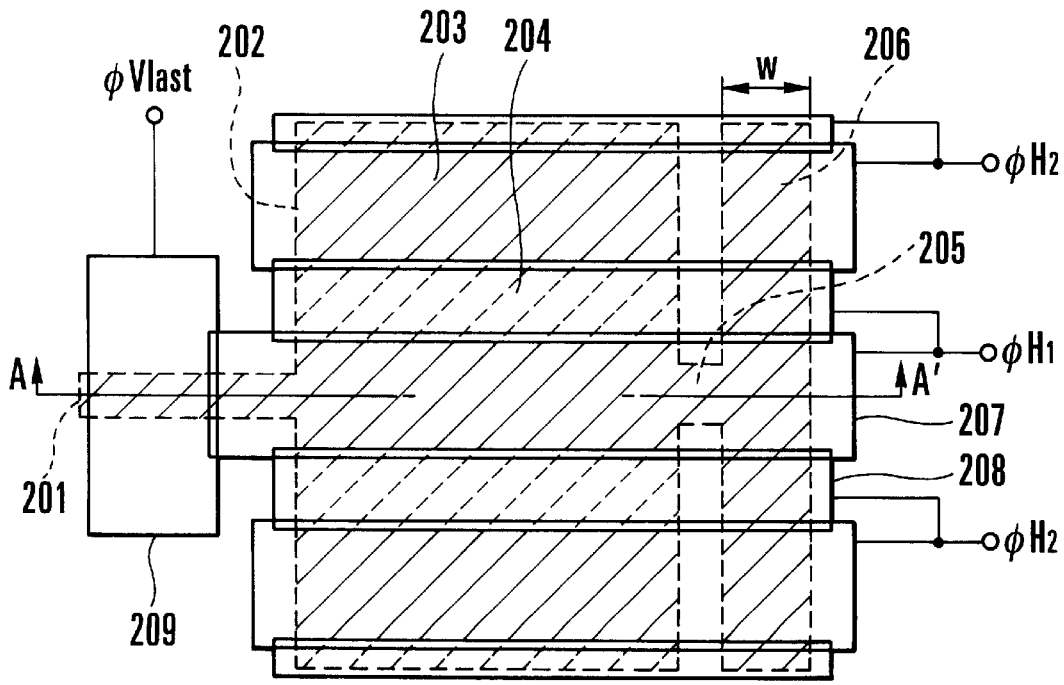
F I G. 11

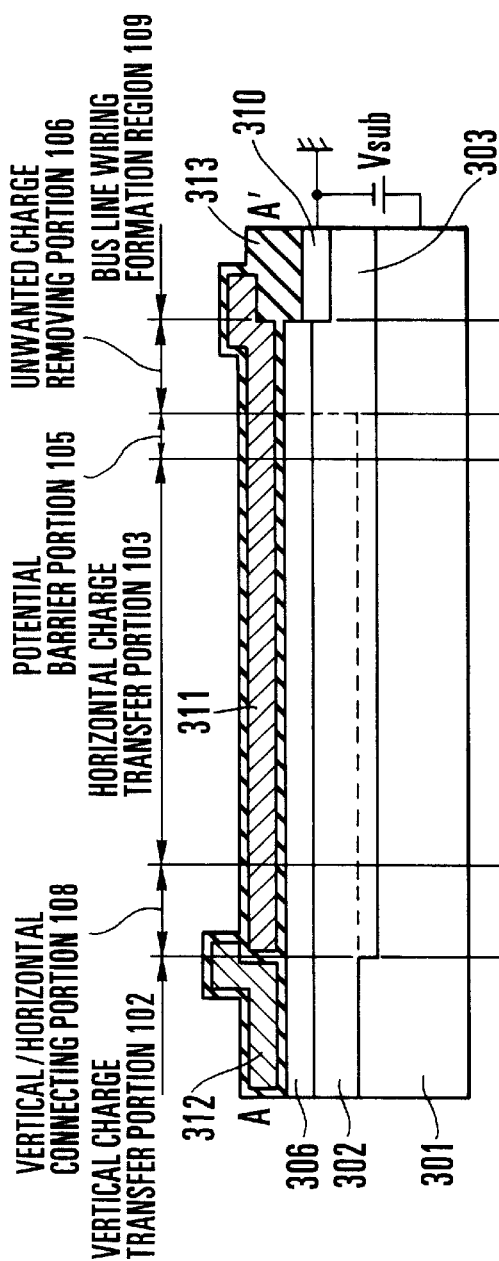
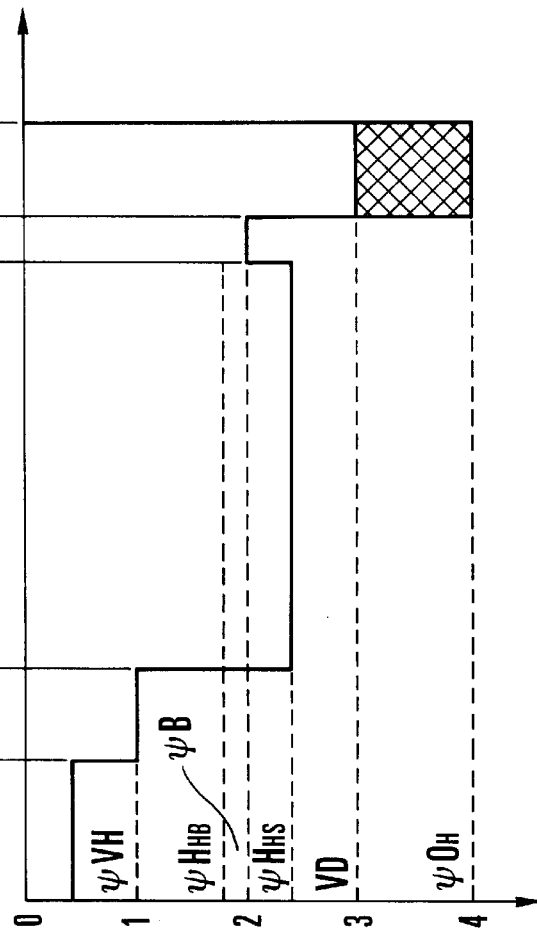
FIG. 12A
FIG. 12B

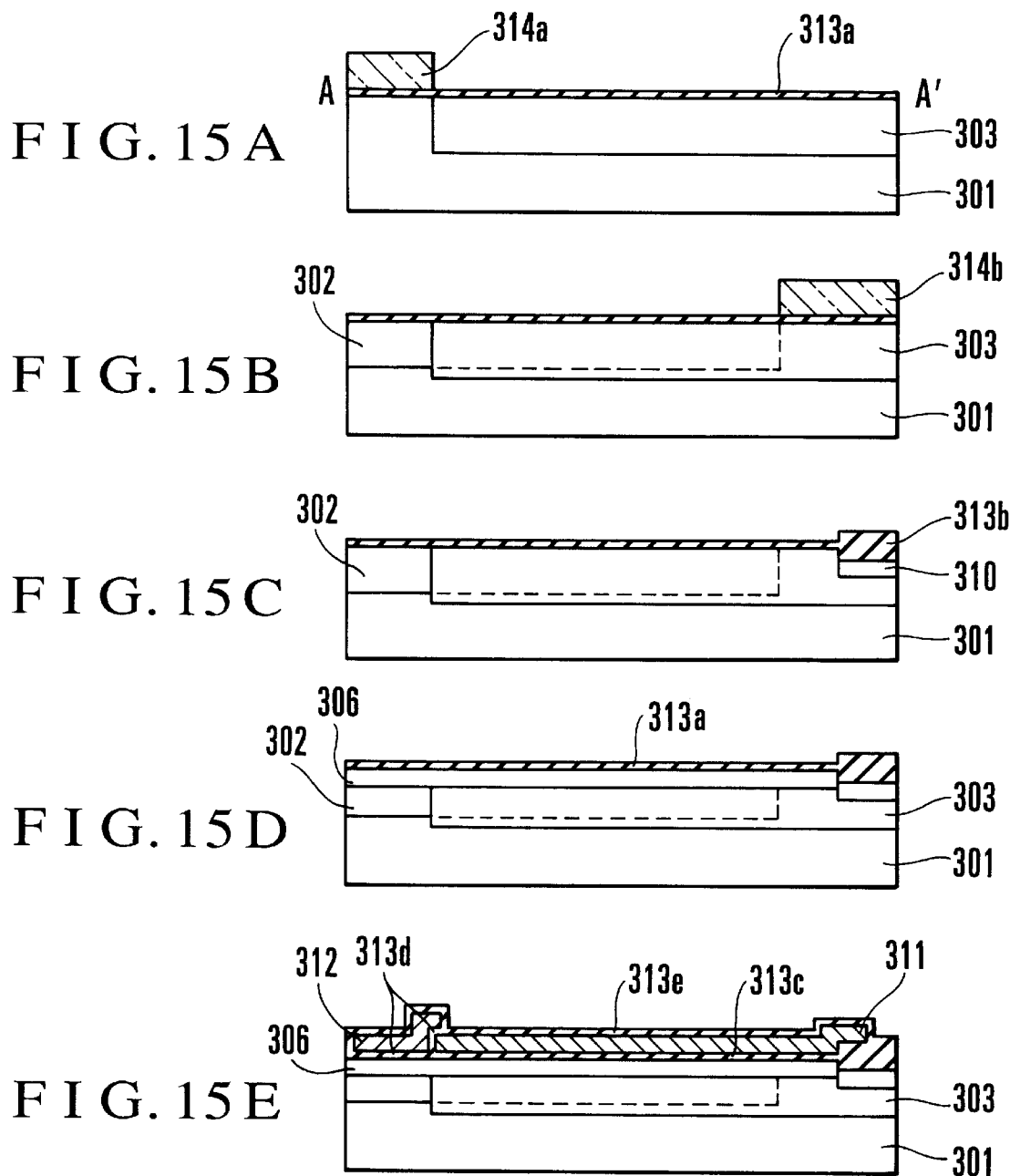

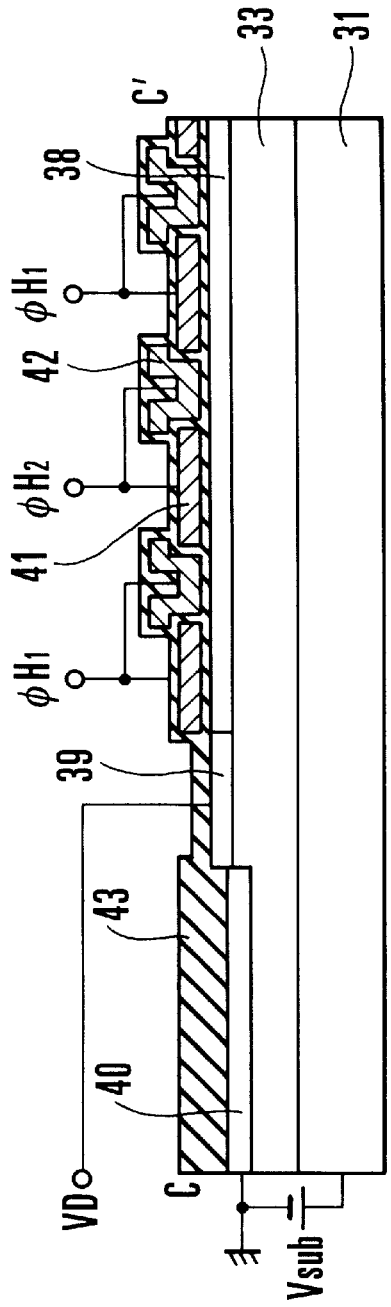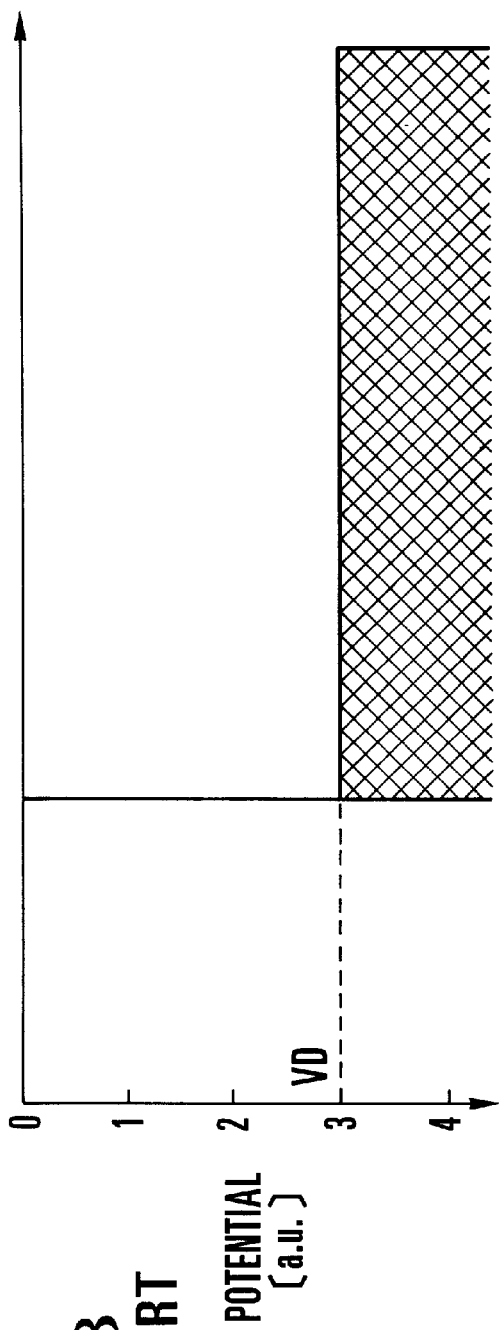
FIG. 23A PRIOR ART
FIG. 23B PRIOR ART

SOLID-STATE IMAGE SENSING DEVICE

BACKGROUND OF THE INVENTION

The present invention relates to a solid-state image sensing device and, more particularly, to a solid-state image sensing device in which a charge removing portion for removing excess charges is formed adjacent to a horizontal charge transfer portion.

A solid-state image sensing device conventionally used as an input device for a camera-integrated VTR (Video Tape Recorder) is being used as an input device for an electronic still camera used to convert optical information into an electrical signal, store it in a storage medium, and form a hard copy of this optical information or enjoy it on a monitor screen, instead of exposing a film.

A solid-state image sensing device of this type has a photoelectric conversion portion, and charge transfer portions for vertically and horizontally transferring signal charges accumulated at this photoelectric conversion portion. With these portions, the solid-state image sensing device can output optical information as an electrical signal. In the solid-state image sensing device, unwanted signal charges such as charges photoelectrically converted in an unwanted period and charges generated at the interface of silicon and silicon oxide films exist in addition to signal charges of originally necessary video signals. When the solid-state image sensing device is used as the input device for the camera-integrated VTR, no unwanted signal charge poses any problem because it settles at a level free from any problem after displaying several frames.

When, however, the solid-state image sensing device is used as the input device for the electronic still camera, unwanted signal charges are superposed on signal charges of original video signals to degrade the image quality. If removal of unwanted signal charges takes a long time, a time lag is generated between triggering by the shutter button and actual opening/closing of the shutter, and the shutter chance may be lost.

For this reason, in the solid-state image sensing device used as the input device for the electronic still camera, unlike the one used in the camera-integrated VTR, all unwanted signal charges present at the photoelectric conversion portion and the vertical and horizontal charge transfer portions must be instantaneously removed at the same time the shutter button is triggered.

As a means of removing unwanted charges, removal of unwanted charges present at the photoelectric conversion portion employs a vertical overflow drain structure in which a lightly doped, thin p⁻-type semiconductor region is formed immediately below an n-type semiconductor region constituting the photoelectric conversion portion, and a reverse bias voltage is applied to an n-type semiconductor device therebelow to deplete the n-type semiconductor region itself and remove all signal charges to the n-type semiconductor substrate (see "CCD Image Sensor with Vertical Overflow Structure", Journal of the Japan TV Society, Vol. 37, No. 10, pp. 782–787, 1983).

Unwanted charges present at the horizontal charge transfer portion are removed to a reset drain formed at the end of the horizontal charge transfer portion by a normal operation because the horizontal transfer portion can operate at a high speed.

To remove unwanted charges present at the vertical charge transfer portion, transfer of at least one to several frames is required because the charge transfer ability of the horizontal charge transfer portion is limited. As a method of removing unwanted charges at the vertical charge transfer portion within a short time, an unwanted charge removing portion is formed adjacent to the horizontal charge transfer portion, and unwanted charges at the vertical charge transfer portion are transferred in the forward direction to the unwanted charge removing portion via the horizontal charge transfer portion (see Japanese Patent Laid-Open Nos. 62-154881 and 2-205359). By adopting this method, unwanted charges can be removed from the device within a short time together with the vertical overflow drain and high-speed transfer of the horizontal charge transfer portion, and an operative state as the input device for the electronic still camera can be formed immediately.

FIG. 19 shows the schematic arrangement of a solid-state image sensing device in which a charge removing portion is formed adjacent to a conventional horizontal charge transfer portion. In FIG. 19, the solid-state image sensing device is constituted by photoelectric conversion portions 11, vertical charge transfer portions 12, a horizontal charge transfer portion 13, an output circuit portion 14, a potential barrier portion 15, an unwanted charge removing portion 16, and an unwanted charge absorbing portion 17 formed at one end of the unwanted charge removing portion 16 to be connected to a power supply voltage.

FIG. 20 shows a region X surrounded by the dotted line in FIG. 19. The conventional solid-state image sensing device having this structure is constituted to separately optimize the diffusion layers of the charge transfer portions 12 and 13 while giving importance to ensuring of the maximum charge handling amount for the vertical charge transfer portion 12 and the transfer efficiency in high-speed transfer for the horizontal charge transfer portion 13 (see IEEE INTERNATIONAL SOLID-STATE CIRCUITS CONFERENCE DIGEST OF TECHNICAL PAPERS, VOL. 37, pp. 222–223, FEBRUARY, 1994).

As shown in FIG. 20, a conventional solid-state image sensing device of this type comprises a vertical charge transfer channel 21, a horizontal charge transfer channel 22 having a charge accumulating region 23 and a charge barrier region 24, a potential barrier portion 25, an unwanted charge removing portion 26, a first horizontal charge transfer electrode 27 made of a first polysilicon layer, a second horizontal charge transfer electrode 28 made of a second polysilicon layer, and a final vertical charge transfer electrode 29.

FIGS. 21A and 21B respectively show a section taken along the line A–A' in FIGS. 19 and 20 and the potential. As shown in FIGS. 21A and 21B, a first p-type well layer 32 constituting the vertical charge transfer portion 12 and having an impurity concentration of about $1.0 \times 10^{16}$ cm$^{-3}$, and a second p-type well layer 33 constituting the horizontal charge transfer portion 13, the potential barrier portion 15, and the unwanted charge removing portion 16 and having an impurity concentration of about $2.5 \times 10^{15}$ cm$^{-3}$ are formed on an n⁻⁻-type semiconductor substrate 31 having an impurity concentration of about $2.5 \times 10^{14}$ cm$^{-3}$.

A first n-type semiconductor region 34 constituting a buried channel of the vertical charge transfer portion 12 and having an impurity concentration of about $2.5 \times 10^{17}$ cm$^{-3}$, a second n-type semiconductor region 35 constituting buried channels of the horizontal charge transfer portion 13 and the potential barrier portion 15 and having an impurity concentration of about $1.0 \times 10^{17}$ cm$^{-3}$ and an n⁺-type semiconductor region 38 constituting the unwanted charge removing portion 16 and having an impurity concentration of about $5.0 \times 10^{18}$ cm$^{-3}$ are formed on the first and second p-type well layers 32 and 33.

A p$^+$-type semiconductor region 40 constituting an element isolation portion so as to surround an active region and having an impurity concentration of about $1.0 \times 10^{18}$ cm$^{-3}$ is formed on the second p-type well layer 33. The first horizontal charge transfer electrode 27 made of a first polysilicon layer 41 and the final vertical charge transfer electrode 29 made of a second polysilicon layer 42 are further formed on the substrate. The transfer electrodes 27 and 29 are surrounded by an insulating film 43. Reference numeral 18 denotes a vertical/horizontal connecting portion; and 19, a bus line wiring formation region.

A constant voltage $V_D$ is applied to the n$^+$-type semiconductor region 38 constituting the unwanted charge removing portion 16 via an n$^{++}$-type semiconductor region 39 (see FIG. 23A) constituting the unwanted charge absorbing portion 17 and having an impurity concentration of about $1.0 \times 10^{20}$ cm$^{-3}$. The potential barrier of the potential barrier portion 15 is formed utilizing the narrow channel effect.

FIGS. 22A and 22B respectively show a section taken along the line B–B' in FIG. 19 and the potential. In FIGS. 22A and 22B, the second p-type well layer 33 constituting the horizontal charge transfer portion 13 is formed on the n$^{---}$-type semiconductor substrate 31. The second n-type semiconductor region 35 constituting the buried channel of the horizontal charge transfer portion 13, an n$^-$-type semiconductor region 37 having an impurity concentration of about $7.5 \times 10^{16}$ cm$^{-3}$, the n$^{++}$-type semiconductor region 39 constituting a floating diffusion layer portion and a reset drain portion, and the p$^+$-type semiconductor region 40 constituting the element isolation portion are formed on the second p-type well layer 33.

The second p-type well layer 33 also serves as a punch-through preventing layer for preventing punch-through from the floating diffusion layer portion and the reset drain portion as the n$^{++}$-type semiconductor region 39 to the n$^{---}$-type semiconductor substrate 31. The horizontal charge transfer electrodes (first and second horizontal charge transfer electrodes 27 and 28) made of the first and second polysilicon layers 41 and 42, an output gate, and the gate of a reset transistor are further formed on the substrate. The constant voltage $V_D$ is applied to the n$^{++}$-type semiconductor region 39 constituting the reset drain of signal charges.

FIGS. 23A and 23B respectively show a section taken along the line C–C' in FIG. 19 and the potential. In FIGS. 23A and 23B, the second p-type well layer 33 constituting the unwanted charge removing portion 16 is formed on the n$^{---}$-type semiconductor substrate 31. The n$^+$-type semiconductor region 38 constituting the unwanted charge removing portion 16, the n$^{++}$-type semiconductor region 39 constituting the unwanted charge absorbing portion 17, and the p$^+$-type semiconductor region 40 constituting the element isolation portion are formed on the second p-type well layer 33.

The second p-type well layer 33 also serves as a punch-through preventing layer for preventing punch-through from the n$^{++}$-type semiconductor region 39 formed as the drain portion at one end of the unwanted charge removing portion 16 to the n$^{---}$-type semiconductor substrate 31. The first polysilicon layer 41 (first horizontal charge transfer electrode 27) and the second polysilicon layer 42 (second horizontal charge transfer electrode 28) are formed on the substrate via the insulating film 43. The constant voltage $V_D$ is applied to the n$^+$-type semiconductor region 38 constituting the unwanted charge removing portion 16 via the n$^{++}$-type semiconductor region 39.

The operation of the conventional solid-state image sensing device having this structure will be described below.

First of all, unwanted charges present at the photoelectric conversion portion 11 are removed. For this purpose, a lightly doped p$^-$-type semiconductor region (not shown) is formed immediately below an n-type semiconductor region (not shown) constituting the photoelectric conversion portion 11. A high reverse bias voltage of normally about 25 V is applied to the n$^{---}$-type semiconductor substrate 31 to deplete the n-type semiconductor region itself and remove all signal charges to the n$^{---}$-type semiconductor substrate 31.

At the same time as this operation, unwanted charges present at the vertical charge transfer portion 12 are simultaneously transferred to the horizontal charge transfer portion 13 by, e.g., a four-phase clock pulse. At this time, a high-level voltage $V_H$ and a low-level voltage $V_L$ are respectively applied to $\phi H_1$ and $\phi H_2$ of the horizontal charge transfer electrodes 27 and 28, as shown in FIG. 24. Excess charges which cannot be accumulated at the horizontal charge transfer portion 13 are swept via a potential $\psi B$ of the potential barrier portion 15 to the n$^+$-type semiconductor region 38 of the unwanted charge removing portion 16 formed adjacent to the potential barrier portion 15, and absorbed and removed via the n$^{++}$-type semiconductor region 39.

The potential $\psi B$ of the potential barrier portion 15 is set deeper than a potential $\psi V_H$ formed at the vertical/horizontal connecting portion 18 so as to prevent charges transferred to the horizontal charge transfer portion 13 from returning to the vertical charge transfer portion 12.

Unwanted charges left at the horizontal charge transfer portion 13 are absorbed in the n$^{++}$-type semiconductor region 39 of the reset drain formed at the end of the horizontal charge transfer portion 13 by a normal high-speed operation of the horizontal charge transfer portion 13 in response to a two-phase clock pulse shown in FIG. 24.

Subsequently, signal charges accumulated in the photoelectric conversion portion 11 by the light amount incident for a predetermined time are read to a corresponding vertical charge transfer portion 12, and vertically transferred to the horizontal charge transfer portion 13 via each vertical charge transfer portion 12. The signal charges are sent to the horizontal charge transfer portion 13 in units of horizontal lines, and horizontally transferred via the horizontal charge transfer portion 13 to be output via the output circuit portion 14.

In the fine solid-state image sensing device having a large number of pixels, the impurity concentrations of the p-type well layer and the n-type semiconductor region at the transfer portions 12 and 13 must be optimally set in order to allow the vertical charge transfer portion 12 to ensure a sufficient charge transfer amount and enable a high-speed transfer operation at the horizontal charge transfer portion 13. At the unwanted charge removing portion 16, the n$^+$-type semiconductor region 38 constituting the unwanted charge removing portion 16 must be kept in an undepleted state in order to allow rapid removal of unwanted charges. In the conventional solid-state image sensing device described above, since the respective regions are formed in separate diffusion steps to meet these demands, five impurity doping steps are required to form, e.g., the device shown in FIG. 21A. For this reason, in the conventional solid-state image sensing device capable of rapid removal of unwanted charges, the number of manufacturing steps is large, resulting in high product cost.

The n$^+$-type semiconductor region 38 constituting the unwanted charge removing portion 16 having a relatively high impurity concentration is formed adjacent to the horizontal charge transfer portion 13 below the horizontal charge transfer electrodes 27 and 28. For this reason, in forming a gate insulating film below the horizontal charge transfer electrodes 27 and 28 in the subsequent step, an abnormal diffusion layer is undesirably formed in the n-type semiconductor region serving as the channel region of the horizontal charge transfer portion 13 or the potential barrier portion 15 due to outward diffusion of an impurity from the $n^+$-type semiconductor region, varying the potential.

SUMMARY OF THE INVENTION

It is an object of the present invention to provide a solid-state image sensing device capable of removing unwanted charges at a high speed which can be manufactured by a smaller number of manufacturing steps.

It is another object of the present invention to provide a solid-state image sensing device in which outward diffusion of an impurity from an unwanted charge removing portion formed adjacent to a horizontal charge transfer portion is suppressed to prevent variations in potentials of the horizontal charge transfer portion and a potential barrier portion.

In order to achieve the above objects, according to the present invention, there is provided a solid-state image sensing device comprising a plurality of photoelectric conversion portions two-dimensionally arranged on one major surface of a semiconductor substrate of a first conductivity type, vertical charge transfer portions respectively arranged adjacent to the photoelectric conversion portions and having a first well layer of a second conductivity type and a first semiconductor region of the first conductivity type formed on the first well layer of the second conductivity type, a horizontal charge transfer portion arranged adjacent to one end side of the vertical charge transfer portions and having a second well layer of the second conductivity type and a second semiconductor region of the first conductivity type formed on the second well layer of the second conductivity type, an unwanted charge removing portion arranged adjacent to the horizontal charge transfer portion on a side opposite to the vertical charge transfer portions to remove an unwanted charge overflowing from the horizontal charge transfer portion, the unwanted charge removing portion having a third well layer of the second conductivity type, and a third semiconductor region of the first conductivity type formed on the third well layer of the second conductivity type, and a potential barrier portion formed between the horizontal charge transfer portion and the unwanted charge removing portion, wherein the first and third semiconductor regions of the first conductivity type are formed by the same step, and the second and third well layers of the second conductivity type are formed by the same step.

BRIEF DESCRIPTION OF THE DRAWINGS

FIGS. 3A and 3B are a sectional view taken along the line A–A' in FIGS. 1 and 2, and a graph of the potential, respectively;

FIGS. 4A and 4B are a sectional view taken along the line B–B' in FIG. 1, and a graph of the potential, respectively;

FIGS. 5A and 5B are a sectional view taken along the line C–C' in FIG. 1, and a graph of the potential, respectively;

FIG. 7 is an enlarged plan view of the main part of a solid-state image sensing device according to the second embodiment of the present invention;

FIGS. 8A and 8B are a sectional view taken along the line A–A' in FIGS. 1 and 7, and a graph of the potential in the second embodiment of the present invention, respectively;

FIGS. 9A and 9B are a sectional view taken along the line C–C' in FIG. 1, and a graph of the potential in the third embodiment of the present invention, respectively;

FIG. 10 is a waveform chart of a clock pulse applied to the horizontal charge transfer portion of a solid-state image sensing device according to the third and sixth embodiments of the present invention;

FIG. 11 is an enlarged plan view of the main part of a solid-state image sensing device according to the fourth embodiment of the present invention;

FIGS. 12A and 12B are a sectional view taken along the line A–A' in FIGS. 1 and 11, and a graph of the potential in the fourth embodiment of the present invention;

FIGS. 15A to 15E are sectional views taken along the line A–A' in FIG. 1, respectively, for explaining steps in a method of manufacturing the solid-state image sensing device according to the fourth embodiment of the present invention;

FIGS. 23A and 23B are a sectional view taken along the line C–C' in FIGS. 19, and a graph of the potential, respectively.

DESCRIPTION OF THE PREFERRED EMBODIMENTS

The present invention will be described in detail below with reference to the accompanying drawings.

Figure 1:
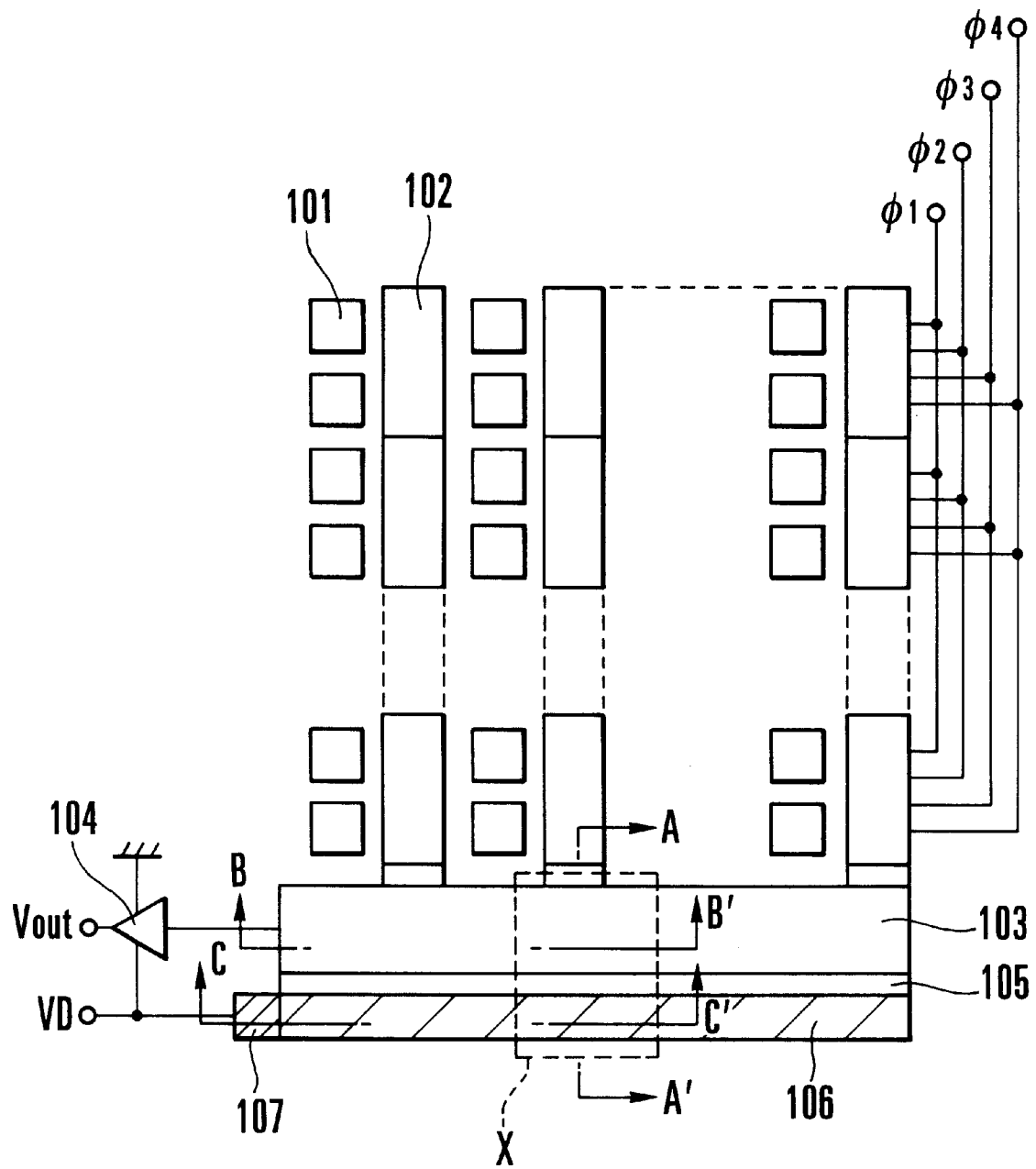
FIG. 1 is a view of the schematic arrangement of a solid-state image sensing device according to the first embodiment of the present invention.

FIG. 1 shows the schematic arrangement of a solid-state image sensing device according to the first embodiment of the present invention. In FIG. 1, reference numeral 101 denotes photoelectric conversion portions for converting incident light into electrical signals; 102, vertical charge transfer portions for reading and vertically transferring signal charges generated by the photoelectric conversion portions 101; 103, a horizontal charge transfer portion for receiving transfer of the signal charges from the vertical charge transfer portions 102 in units of horizontal lines, and horizontally transferring the signal charges; 104, an output circuit portion for converting the signal charges transferred from the horizontal charge transfer portion 103 into a voltage signal; 105, a potential barrier portion; 106, an unwanted charge removing portion for removing charges overflowing from the horizontal charge transfer portion 103 via the potential barrier portion 105; and 107, an unwanted charge absorbing portion formed at one end of the unwanted charge removing portion 106 and constituted by an $n^{++}$-type semiconductor region connected to the power supply voltage $V_D$.

Figure 2:
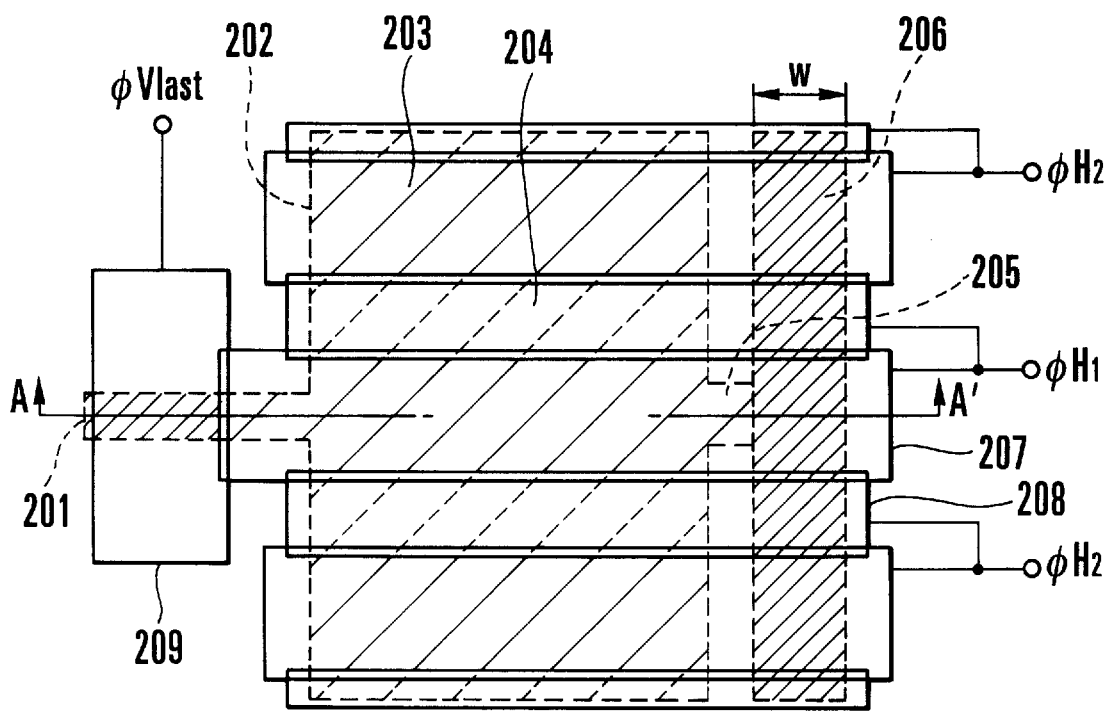
FIG. 2 is an enlarged plan view of the main part of the solid-state image sensing device shown in FIG. 1.

FIG. 2 shows a region surrounded by the dotted line X as the main part of the solid-state image sensing device in FIG. 1. In FIG. 2, reference numeral 201 denotes a vertical charge transfer channel; 202, a horizontal charge transfer channel having a charge accumulating region 203 and a charge barrier region 204; 205, a potential barrier portion in which the potential is narrowed by the narrow channel effect; 206, an unwanted charge removing portion for removing unwanted charges overflowing from the horizontal charge transfer channel 202 via the potential barrier portion 205; 207, a first horizontal charge transfer electrode made of a first polysilicon layer; 208, a second horizontal charge transfer electrode made of a second polysilicon layer; and 209, a final vertical charge transfer electrode made of the second polysilicon layer. The potential barrier portion 205 and the unwanted charge removing portion 206 respectively correspond to the potential barrier portion 105 and the unwanted charge removing portion 106 in FIG. 1.

FIGS. 3A and 3B respectively show the section, taken along the line A–A' in FIGS. 1 and 2, and potential of the solid-state image sensing device according to the first embodiment. In FIGS. 3A and 3B, reference numeral 301 denotes an $n^{--}$-type semiconductor substrate having an impurity concentration of about $2.5 \times 10^{14}$ cm$^{-3}$; 302, a first p-type well layer constituting the vertical charge transfer portion 102 and having an impurity concentration of about $1.0 \times 10^{16}$ cm$^{-3}$; 303, a second p-type well layer constituting the horizontal charge transfer portion 103, the potential barrier portion 105 (205), and the unwanted charge removing portion 106 (206) and having an impurity concentration of about $2.5 \times 10^{15}$ cm$^{-3}$; 304, a first n-type semiconductor region constituting a buried channel of the vertical charge transfer portion 102 and the unwanted charge removing portion 106 and having an impurity concentration of about $2.5 \times 10^{17}$ cm$^{-3}$; and 305, a second n-type semiconductor region constituting buried channels of the horizontal charge transfer portion 103 and the potential barrier portion 105 and having an impurity concentration of about $1.0 \times 10^{17}$ cm$^{-3}$.

Reference numeral 310 denotes a p+-type semiconductor region constituting an element isolation portion and having an impurity concentration of about $1.0 \times 10^{18}$ cm$^{-3}$; 311, a first polysilicon layer constituting the first horizontal charge transfer electrode 207; and 312, a second polysilicon layer constituting the final vertical charge transfer electrode 209. The constant voltage $V_D$ is applied to the first n-type semiconductor region 304 constituting the unwanted charge removing portion 106 (206) via an $n^{++}$-type semiconductor region 309 (see FIG. 5A) serving as the unwanted charge absorbing portion 107. Reference numeral 108 denotes a vertical/horizontal connecting portion; and 109, a bus line wiring formation region.

Figure 22A:
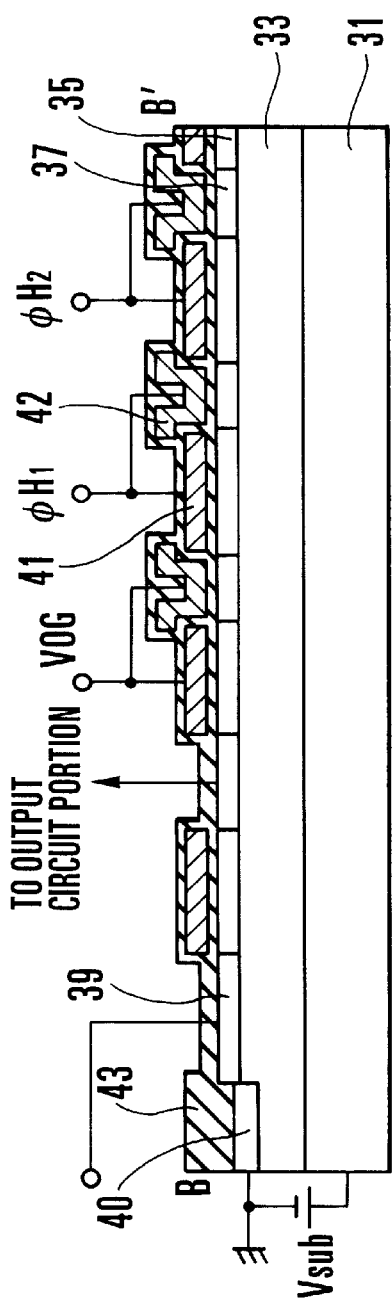
FIGS. 22A and 22B are a sectional view taken along the line B–B' in FIGS. 19, and a graph of the potential, respectively.
Figure 22B:
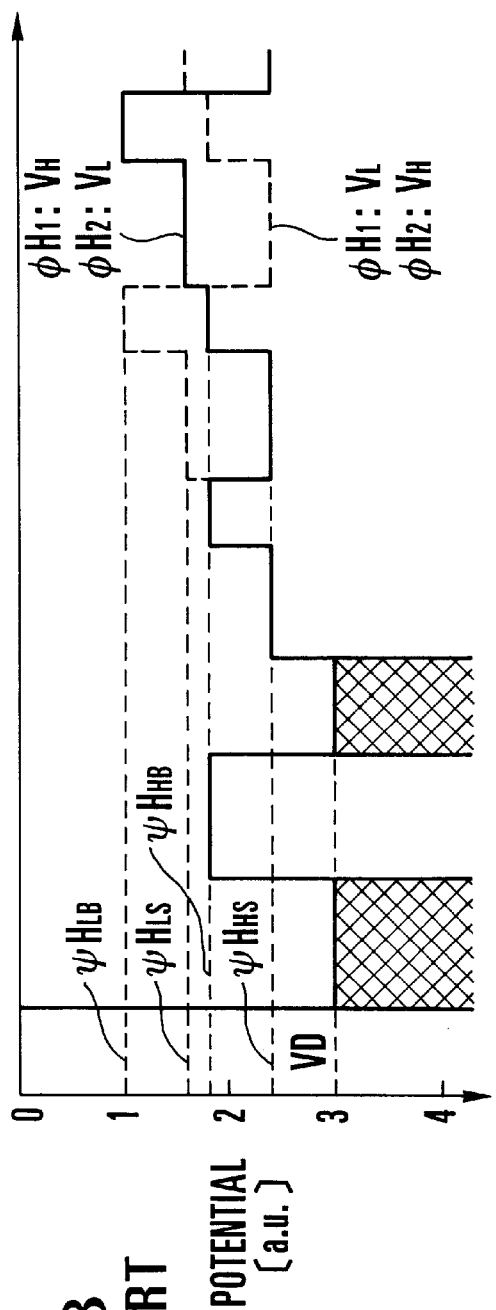
Figure 24:
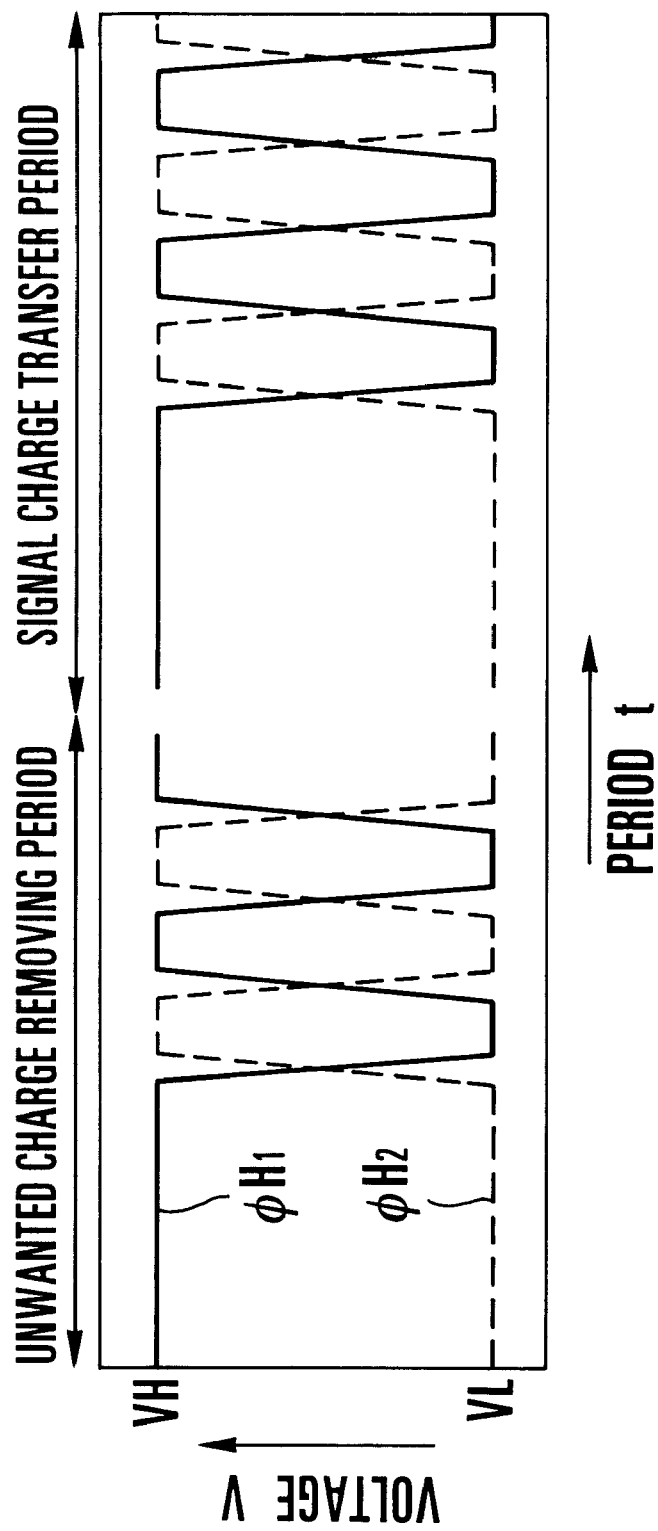
FIG. 24 is a waveform chart of a clock pulse applied to the horizontal charge transfer portion of the conventional solid-state image sensing device.

FIGS. 4A and 4B respectively show the section, taken along the line B–B' in FIG. 1, and potential of the solid-state image sensing device according to the first embodiment. The solid-state image sensing device shown in FIGS. 4A and 4B has the same arrangement as that of the conventional solid-state image sensing device shown in FIGS. 22A and 22B, and a detailed description thereof will be omitted.

FIGS. 5A and 5B respectively show a section taken along the line C–C' in FIG. 1, and the potential in the first embodiment. In FIGS. 5A and 5B, the second p-type well layer 303 and the first n-type semiconductor region 304 which constitute the unwanted charge removing portion 106 (206) are stacked on the $n^{--}$-type semiconductor substrate 301. The $n^{++}$-type semiconductor region 309 constituting the unwanted charge absorbing portion 107 connected to the power supply voltage $V_D$ is formed at one end of the first n-type semiconductor region 304. The second p-type well layer 303 functions to prevent punch-through from the $n^{++}$-type semiconductor region 309 to the $n^{--}$-type semiconductor substrate 301. The first n-type semiconductor region 304 and the $n^{++}$-type semiconductor region 309 are formed in a region surrounded by the p+-type semiconductor region 310 constituting the element isolation portion. On the substrate having these regions formed thereon, i.e., on the n-type semiconductor region 304, the first and second polysilicon layers 311 and 312 respectively constituting the charge transfer electrodes 207 and 208 of the horizontal charge transfer portion 103 are formed to be surrounded by an insulating film 313.

FIGS. 6A to 6F respectively show sections taken along the line A–A' in FIGS. 1 and 2 for explaining the main steps in manufacturing the solid-state image sensing device according to the first embodiment.

Figure 6A:
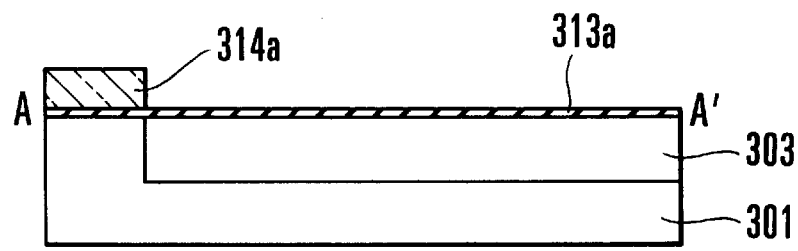
FIGS. 6A to 6F are sectional views taken along the line A–A' in FIG. 1, respectively, for explaining steps in a method of manufacturing the solid-state image sensing device according to the first embodiment of the present invention.

A thin insulating film (e.g., a silicon oxide film) 313a is formed on an $n^{--}$-type semiconductor substrate 301, and a photoresist film 314a is selectively formed on the insulating film 313a by photolithography. Using the photoresist film 314a as a mask, a p-type impurity (e.g., boron) is ion-implanted (and thermally diffused) in the $n^{--}$-type semiconductor substrate 301 to form a second p-type well layer 303 (FIG. 6A).

Figure 6B:
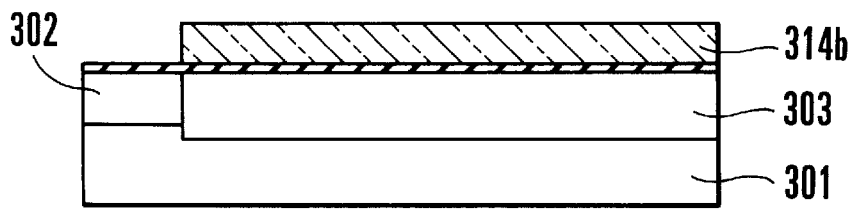

After removing the photoresist film 314a, a photoresist film 314b is formed in the region of the second p-type well layer 303 by photolithography. Using the photoresist film 314b as a mask, a p-type impurity (e.g., boron) is ion-implanted (and thermally diffused) in the $n^{--}$-type semiconductor substrate 301 to form a first p-type well layer 302 (FIG. 6B).

Note that the first and second p-type well layers 302 and 303 are formed by the separate ion implantation steps. Alternatively, boron may be ion-implanted in the formation regions of the first and second p-type well layers 302 and 303 in the first ion implantation, and ions may be implanted in only the formation region of the first p-type well layer 302 in the second ion implantation.

Figure 6C:
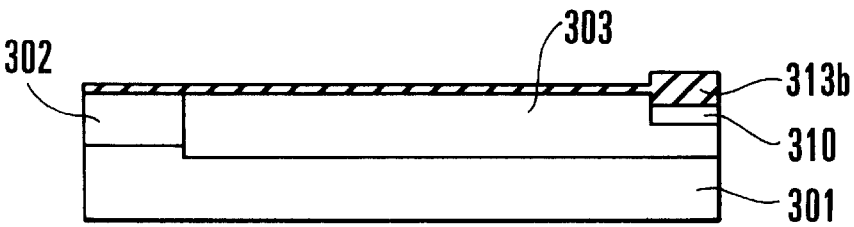

After removing the photoresist film 314b, a stacked film made up of a $p^+$-type semiconductor region 310 serving as an element isolation portion, and a thick insulating film (e.g., a silicon oxide film) 313b is selectively formed on the second p-type well layer 303 and the insulating film 313a using ion implantation and well-known LOCOS (LOCal Oxidation of Silicon) (FIG. 6C).

Figure 6D:
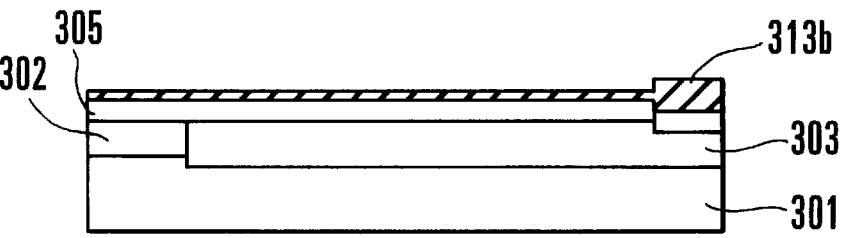

Using the thick insulating film 313b as a mask, an n-type impurity (e.g., phosphorus) is ion-implanted in the first and second p-type well layers 302 and 303 to form a second n-type semiconductor region 305 (FIG. 6D).

Figure 6E:
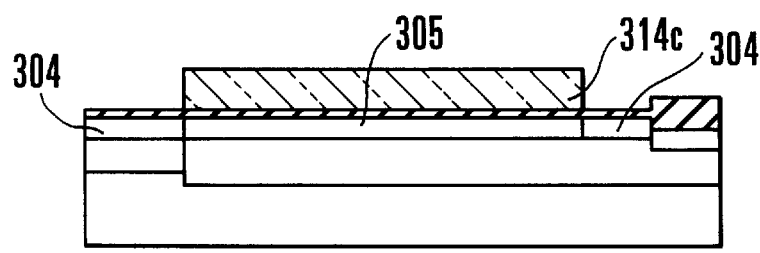

A photoresist film 314c is selectively formed on the second n-type semiconductor region 305 using photolithography. Using the photoresist film 314c and the thick insulating film 313b as a mask, an n-type impurity (e.g., phosphorus) is ion-implanted in the second n-type semiconductor region 305 to form a first n-type semiconductor region 304 (FIG. 6E).

The first n-type semiconductor region 304 is formed by two n-type impurity ion implantation steps. Although the first embodiment exemplifies the case wherein the first and second n-type semiconductor regions 304 and 305 have the same junction depth, the first and second n-type semiconductor regions 304 and 305 may be formed as two n-type semiconductor regions having different junction depths.

Figure 6F:
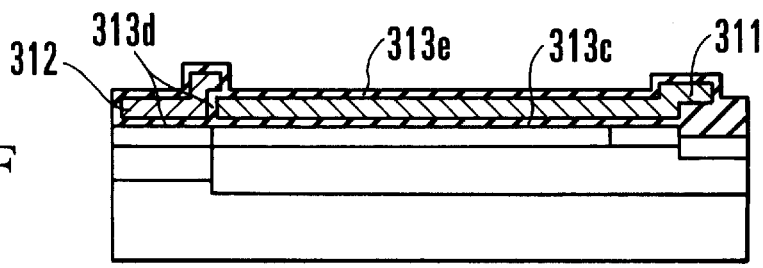

After removing the photoresist film 314c and the insulating film 313a, a charge transfer electrode 207 of a horizontal charge transfer portion 103 made of a first polysilicon layer 311 is formed via an insulating film (e.g., a silicon oxide film) 313c. A charge transfer electrode 209 of a vertical charge transfer portion 102 made of a second polysilicon layer 312 is formed via an insulating film (e.g., a silicon oxide film) 313d (FIG. 6F).

Thereafter, an interlevel insulating film 313e is formed on the first and second polysilicon layers 311 and 312 constituting electrodes, using thermal oxidation, CVD (Chemical Vapor Deposition), or the like, and a wiring pattern of a metal film is formed.

In the solid-state image sensing device of the first embodiment, the first n-type semiconductor region 304 and the second p-type well layer 303 constitute the unwanted charge removing portion 106 (206). The voltage $V_D$ is set to be deeper than a potential $\psi H_{HS}$ of the horizontal charge transfer portion 103 formed below the charge transfer electrode applied with a potential $V_H$ shown in FIGS. 3A and 3B, and shallower than the shallowest potential $\psi O_L$ of the unwanted charge removing portion 106 formed below the charge transfer electrode applied with a potential $V_L$ shown in FIGS. 5A and 5B. With this setting, the unwanted charge removing portion 106 becomes in an undepleted state, whereas the charge transfer channel region of the horizontal charge transfer portion 103 becomes in a depleted state. Therefore, the solid-state image sensing device of the first embodiment operates similarly to the conventional solid-state image sensing device shown in FIGS. 19 to 23B.

In the solid-state image sensing device of the first embodiment, since the unwanted charge removing portion 106 (206) is made up of the second p-type well layer 303 constituting the horizontal charge transfer portion 103 and the first n-type semiconductor region 304 constituting the vertical charge transfer portion 102, the number of manufacturing steps is lower than that of the conventional solid-state image sensing device.

In this case, a difference $\Delta\psi$ between the potential $\psi O_L$ of the unwanted charge removing portion 106 (206) and the voltage $V_D$ is desirably 0.5 V or more. A width W of the unwanted charge removing portion 106 (206) is preferably 6 $\mu$m or more not to generate the narrow channel effect.

FIG. 7 shows the region X of a solid-state image sensing device according to the second embodiment that is surrounded by the dotted line in FIG. 1. FIGS. 8A and 8B respectively show a section taken along the line A–A' in FIGS. 1 and 7, and the potential. The second embodiment is an improvement of the first embodiment. The same reference numerals as in the first embodiment shown in FIGS. 2 and 3A denote the same parts in FIGS. 7 and 8A, and a description thereof will be omitted.

The second embodiment is characterized in that a first n-type semiconductor region 304 constituting an unwanted charge removing portion 206 (106) is formed to be offset from a potential barrier portion 205 (105) by a distance L, and a second n-type semiconductor region 305 is formed in the remaining offset region, as shown in FIGS. 7, 8A, and 8B.

For this reason, in the solid-state image sensing device of the second embodiment, even if the first n-type semiconductor region 304 constituting the unwanted charge removing portion 206 (106) offsets due to a processing variation such as an alignment offset, the potential barrier portion 205 (105) and the first n-type semiconductor region 304 do not overlap each other, and the potential of the potential barrier portion 205 (105) can be stabilized. In this case, the distance L is desirably 1 $\mu$m or more.

FIGS. 9A and 9B respectively show the section, taken along the line C–C' in FIG. 1, and potential of a solid-state image sensing device according to the third embodiment of the present invention. FIG. 10 shows a clock pulse applied to the horizontal charge transfer portion of the solid-state image sensing device shown in FIGS. 9A and 9B. The third embodiment is also an improvement of the first embodiment.

In the third embodiment, when unwanted charges present at a vertical charge transfer portion 102 are transferred to a horizontal charge transfer portion 103, clock pulses $\phi H_1$ and $\phi H_2$ applied to horizontal charge transfer electrodes 207 and 208 are kept at the high-level voltage $V_H$, as shown in FIG. 10.

For this reason, in the solid-state image sensing device of the third embodiment, since the potential $V_H$ is applied, the difference $\Delta\psi$ ($V_D$–$\psi O_H$) between the potential of an unwanted charge removing portion 106 (206) formed below the charge transfer electrodes 207 and 208, and the voltage $V_D$ can widen to set the setting margin of the constant voltage $V_D$ wider than that in the first embodiment.

FIG. 11 shows the region X of a solid-state image sensing device according to the fourth embodiment that is surrounded by the dotted line in FIG. 1. This solid-state image sensing device has the same arrangement as that in FIG. 2, and a description thereof will be omitted. FIGS. 12A and 12B respectively show the section, taken along the line A–A' in FIGS. 1 and 11, and potential of the solid-state image sensing device according to the fourth embodiment. In FIGS. 12A and 12b, reference numeral 301 denotes an n$^{--}$-type semiconductor substrate having an impurity concentration of about 2.0×10$^{14}$ cm$^{-3}$; 302, a first p-type well layer constituting a vertical charge transfer portion 102, a horizontal charge transfer portion 103, and a potential barrier portion 105 (205) and having an impurity concentration of about 1.0×10$^{16}$ cm$^{-3}$; and 303, a second p-type well layer constituting the horizontal charge transfer portion 103, the potential barrier portion 105 (205), and an unwanted charge removing portion 106 (206) and having an impurity concentration of about 2.5×10$^{15}$ cm$^{-3}$.

Reference numeral 306 denotes an n-type semiconductor region constituting buried channels of the horizontal charge transfer portion 103 and the potential barrier portion 105 (205), and the unwanted charge removing portion 106 (206) and having an impurity concentration of about 2.5×10$^{17}$ cm$^{-3}$; 310, a p$^+$-type semiconductor region constituting an element isolation portion and having an impurity concentration of about $1.0 \times 10^{18}$ cm$^{-3}$; 311, a first polysilicon layer constituting a first horizontal charge transfer electrode 207; and 312, a second polysilicon layer constituting a final vertical charge transfer electrode 209.

The constant voltage $V_D$ is applied to the n-type semiconductor region 306 constituting the unwanted charge removing portion 106 (206) via an n$^{++}$-type semiconductor region 309 (FIG. 14A) serving as an unwanted charge absorbing portion 107.

Figures 13A, 13B:
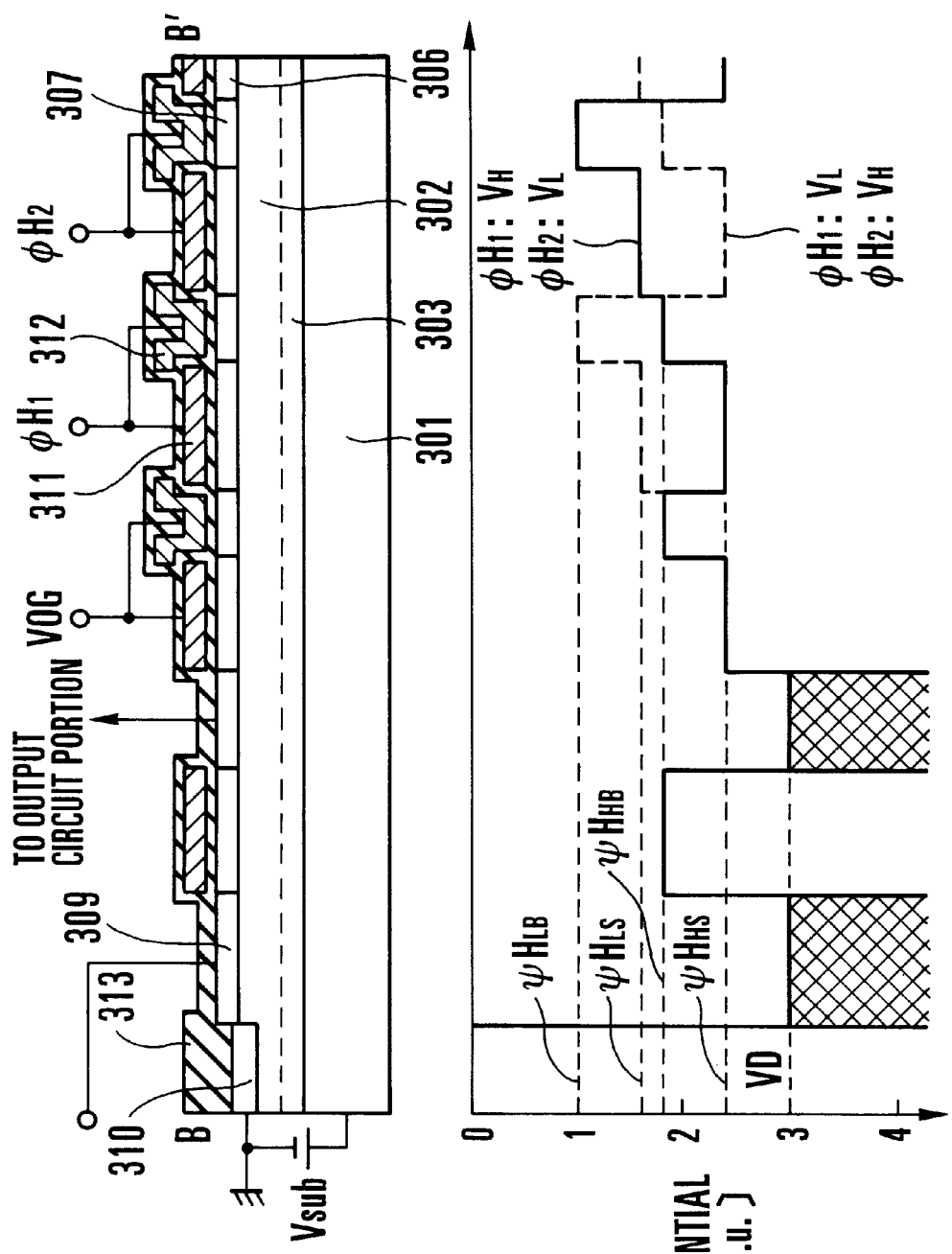
FIGS. 13A and 13B are a sectional view taken along the line B–B' in FIG. 1, and a graph of the potential in the fourth embodiment of the present invention.

FIGS. 13A and 13B respectively show the section, taken along the line B–B' in FIG. 1, and potential of the solid-state image sensing device according to the fourth embodiment of the present invention. In FIGS. 13A and 13B, the first and second p-type well layers 302 and 303 constituting the unwanted charge removing portion 106 (206) are stacked on the n$^{---}$-type semiconductor substrate 301. The n-type semiconductor region 306 constituting the buried channel of the horizontal charge transfer portion 103, an n$^{-}$-type semiconductor region 307 having an impurity concentration of about $1.8 \times 10^{17}$ cm$^{-3}$, the n$^{++}$-type semiconductor region 309 constituting a floating diffusion layer portion and a reset drain portion, and the p$^+$-type semiconductor region 310 constituting the element isolation portion are formed on the first and second p-type well layers 302 and 303. On the substrate having these regions formed thereon, horizontal charge transfer electrodes (first and second horizontal charge transfer electrodes 207 and 208) made of the first and second polysilicon layers 311 and 312, an output gate, and the gate of a reset transistor are formed via an insulating film 313. The constant voltage $V_D$ is applied to the n$^{++}$-type semiconductor region 309 constituting the reset drain of signal charges.

Figure 14A:
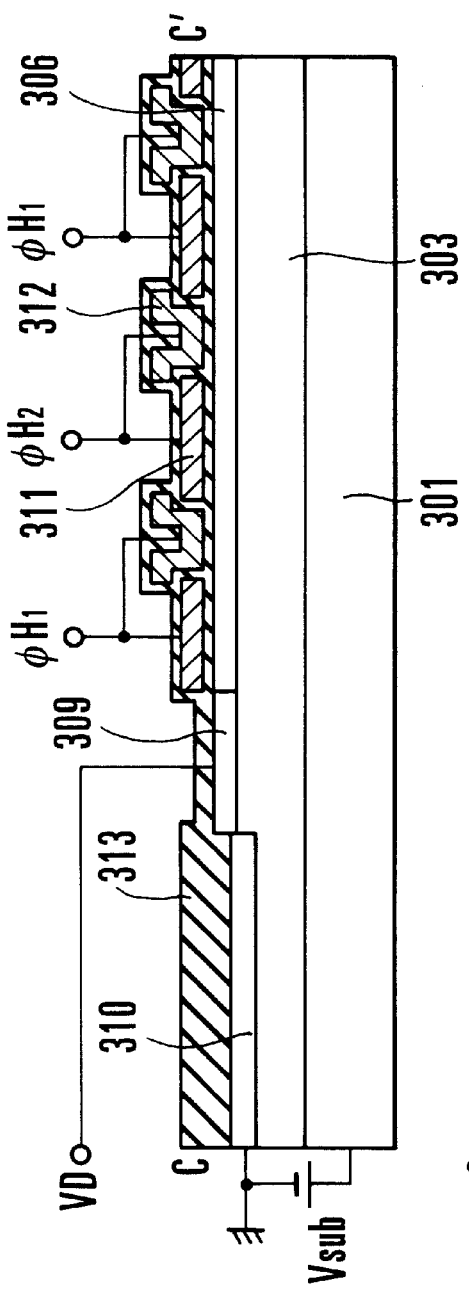
FIGS. 14A and 14B are a sectional view taken along the line C–C' in FIG. 1, and a graph of the potential in the fourth embodiment of the present invention.
Figure 14B:
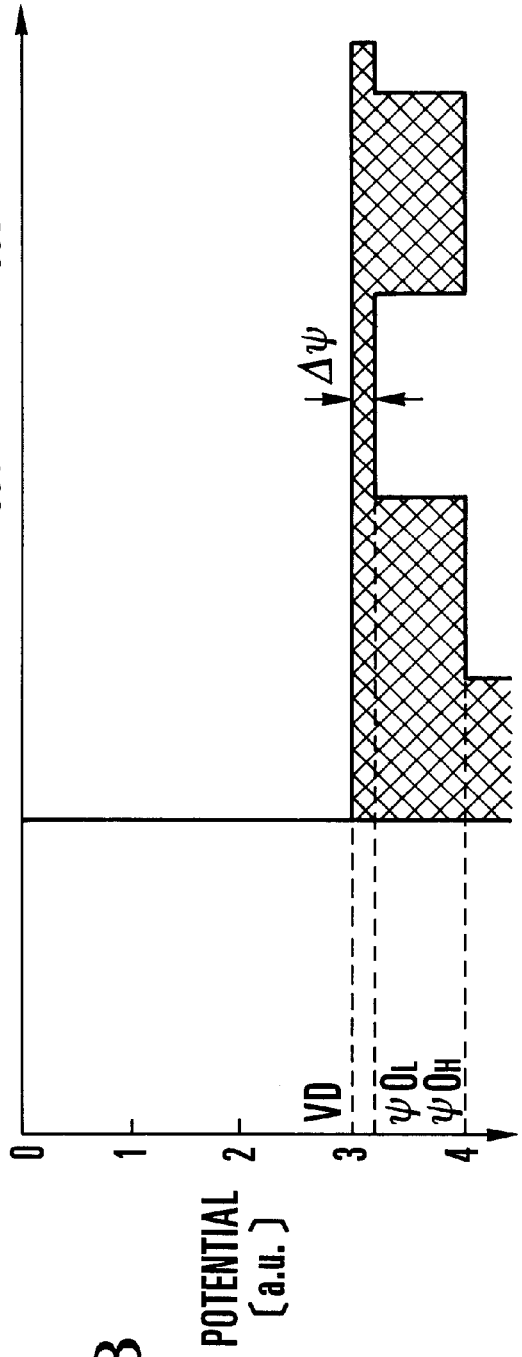

FIGS. 14A and 14B respectively show the section, taken along the line C–C' in FIG. 1, and potential of the solid-state image sensing device according to the fourth embodiment. As shown in FIGS. 14A and 14B, the second p-type well layer 303 and the n-type semiconductor region 306 which constitute the unwanted charge removing portion 106 (206) are stacked on the n$^{---}$-type semiconductor substrate 301. The n$^{++}$-type semiconductor region 309 constituting the unwanted charge absorbing portion 107 connected to the power supply voltage $V_D$, and having an impurity concentration of about $1.0 \times 10^{20}$ cm$^{-3}$ is formed in contact with one end of the n-type semiconductor region 306. The n-type semiconductor region 306 and the n$^{++}$-type semiconductor region 309 are formed in a region surrounded by the p$^+$-type semiconductor region 310 constituting the element isolation portion. On the substrate having these regions formed thereon, the first and second polysilicon layers 311 and 312 respectively constituting the charge transfer electrodes 207 and 208 of the horizontal charge transfer portion 103 are formed to be surrounded by the insulating film 313.

FIGS. 15A to 15F respectively show sections taken along the line A–A' in FIGS. 1 and 11 for explaining the main steps in manufacturing the solid-state image sensing device according to the fourth embodiment.

A thin insulating film (e.g., a silicon oxide film) 313a is formed on an n$^{---}$-type semiconductor substrate 301. Using the photoresist film 314a formed by photolithography as a mask, a p-type impurity (e.g., boron) is ion-implanted (and thermally diffused) in the substrate 301 to selectively form a second p-type well layer 303 (FIG. 15A). Using a photoresist film 314b formed by photolithography as a mask, a p-type impurity (e.g., boron) is ion-implanted (and thermally diffused) in the substrate 301 to selectively form a first p-type well layer 302 (FIG. 15B).

A p$^+$-type semiconductor region 310 constituting an element isolation portion, and a thick insulating film (e.g., a silicon oxide film) 313b are stacked on a second p-type well layer 303 using ion implantation and well-known LOCOS (FIG. 15C).

Using the thick insulating film 313b as a mask, an n-type impurity (e.g., phosphorus) is ion-implanted in the first and second p-type well layers 302 and 303 to form an n-type semiconductor region 306 (FIG. 15D).

After removing the insulating film 313a, an insulating film (e.g., a silicon oxide film) 313c is newly formed on the n-type semiconductor region 306. A charge transfer electrode 207 of vertical and horizontal charge transfer portions 102 and 103 made of a first polysilicon layer 311 is formed via the insulating film 313c. A charge transfer electrode 209 of the vertical charge transfer portion 102 made of a second polysilicon layer 312 is formed via an insulating film (e.g., a silicon oxide film) 313d (FIG. 15E).

Thereafter, an interlevel insulating film 313e is formed on the first and second polysilicon layers 311 and 312 using thermal oxidation, CVD, and the like, and a wiring pattern of a metal film is formed.

The solid-state image sensing device of the fourth embodiment described above is characterized in that the n-type semiconductor region 306 and the second p-type well layer 303 constitute the unwanted charge removing portion 106 (206). In this case, the voltage $V_D$ is set to be deeper than the potential $\psi H_{HS}$ of the horizontal charge transfer portion 103 formed below the charge transfer electrode 207 applied with the potential VH shown in FIGS. 12A and 12B, and shallower than the shallowest potential $\psi O_L$ of the unwanted charge removing portion 106 (206) formed below the charge transfer electrode 207 applied with the potential $V_L$ shown in FIGS. 14A and 14B. With this setting, the unwanted charge removing portion 106 (206) becomes in an undepleted state, whereas the charge transfer channel region of the horizontal charge transfer portion 103 becomes in a depleted state. Therefore, the solid-state image sensing device of the fourth embodiment operates similarly to the conventional solid-state image sensing device shown in FIGS. 19 to 23B. In the solid-state image sensing device of the fourth embodiment, since the unwanted charge removing portion 106 (206) is made up of the second p-type well layer 303 constituting the horizontal charge transfer portion 103 and the n-type semiconductor region 306 constituting the vertical and horizontal charge transfer portions 102 and 103, the number of manufacturing steps can be decreased more than the solid-state image sensing device of the first embodiment.

In the fourth, the difference $\Delta \psi$ between the potential $\psi O_L$ of the unwanted charge removing portion 106 (206) and the voltage $V_D$ is desirably 0.5 V or more. The width W of the unwanted charge removing portion 106 (206) is preferably 6 $\mu$m or more not to generate the narrow channel effect.

Figure 16:
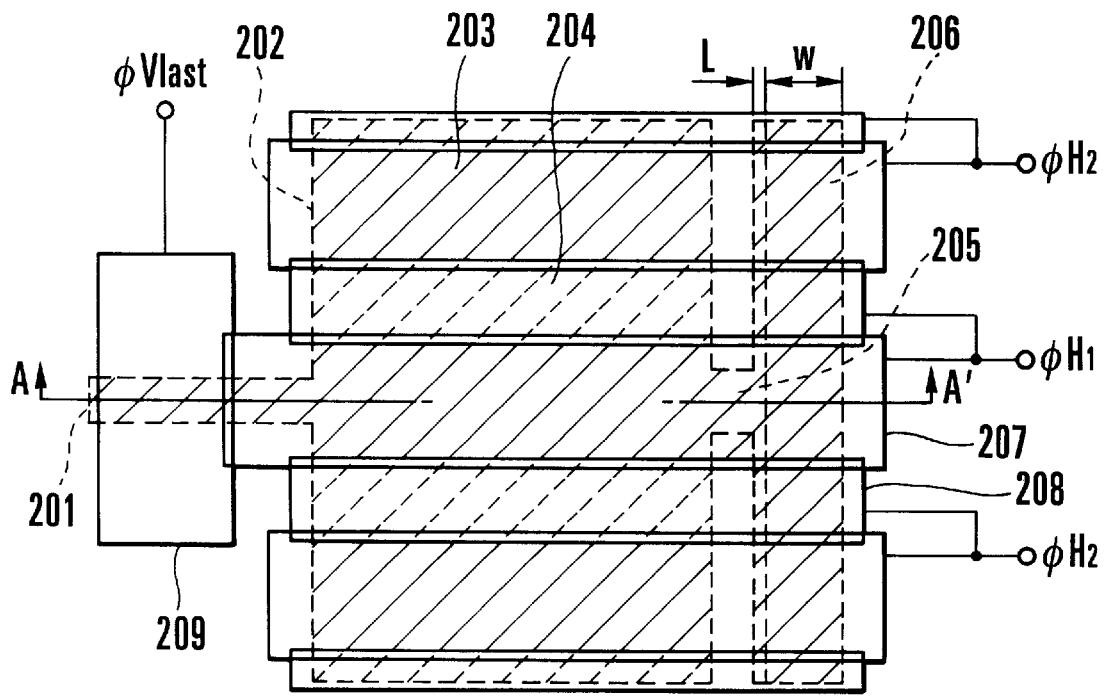
FIG. 16 is an enlarged plan view of the main part of a solid-state image sensing device according to the fifth embodiment of the present invention.
Figures 17A, 17B:
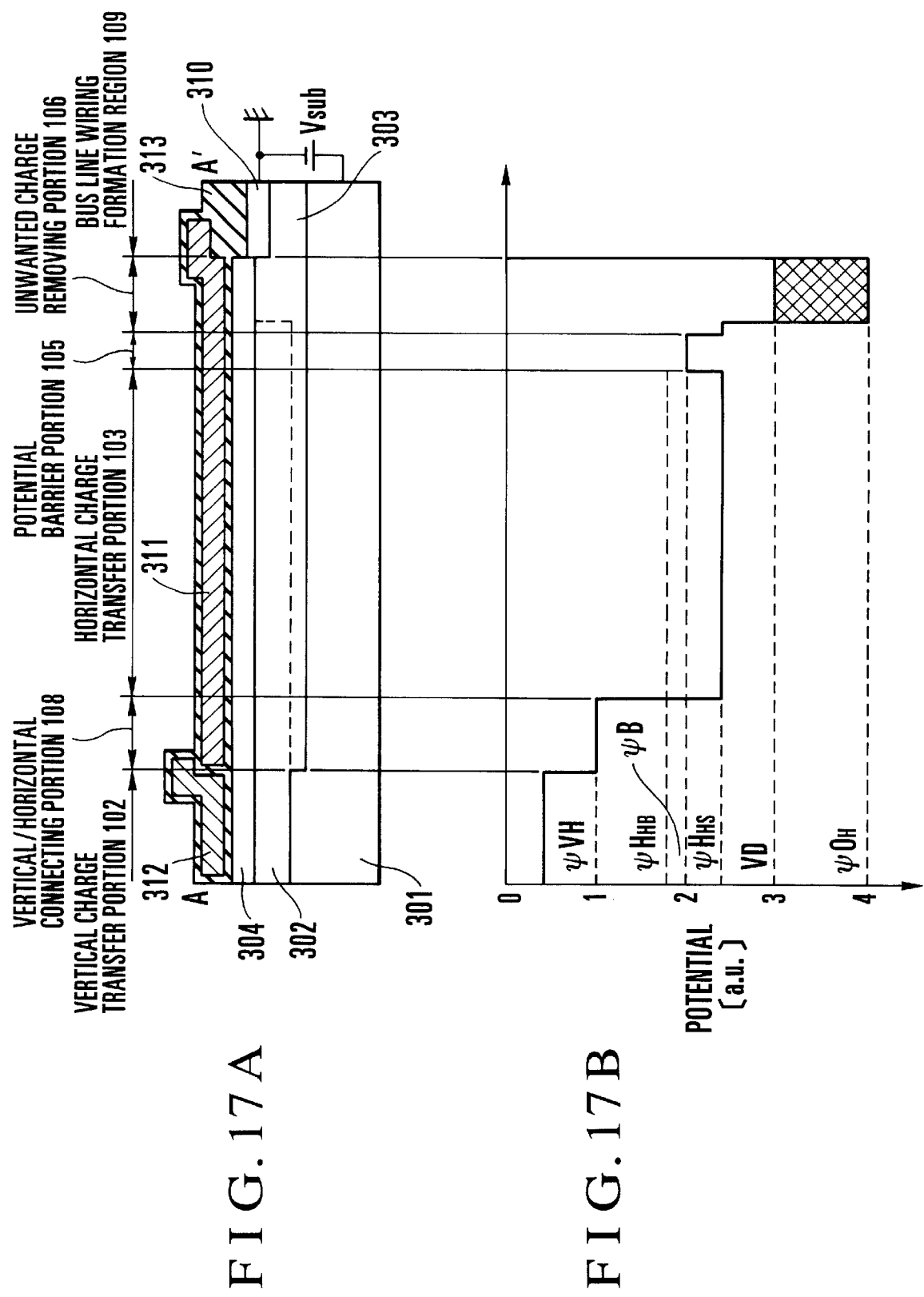
FIGS. 17A and 17B are a sectional view taken along the line A–A' in FIGS. 1 and 16, and a graph of the potential in the fifth embodiment of the present invention, respectively.

FIG. 16 shows the region X of a solid-state image sensing device according to the fifth embodiment that is surrounded by the dotted line in FIG. 1. FIGS. 17A and 17B respectively show the section taken along the line A–A' in FIGS. 1 and 16, and the potential in the fifth embodiment of the present invention. The fifth embodiment is an improvement of the fourth embodiment.

The same reference numerals as in the fourth embodiment shown in FIGS. 11, 12A, and 12B denote the same parts in FIGS. 16, 17A, and 17B, and a repetitive description thereof will be omitted. The fifth embodiment is characterized in that a second p-type well layer 303 constituting an unwanted charge removing portion 206 (106) is formed to be offset from a potential barrier portion 205 (105) by a distance L, and a first p-type well layer 302 is formed in the remaining offset region, as shown in FIGS. 16, 17A, and 17B.

For this reason, in the solid-state image sensing device of the fifth embodiment, even if the first p-type well layer 302 constituting the unwanted charge removing portion 206 (106) offsets due to a processing variation such as an alignment offset, the end portion of the first p-type well layer 302 does not cut into the potential barrier portion 205, and the potential of the potential barrier portion 205 can be stabilized. In this case, the distance L is desirably 1 μm or more.

Figure 18A:
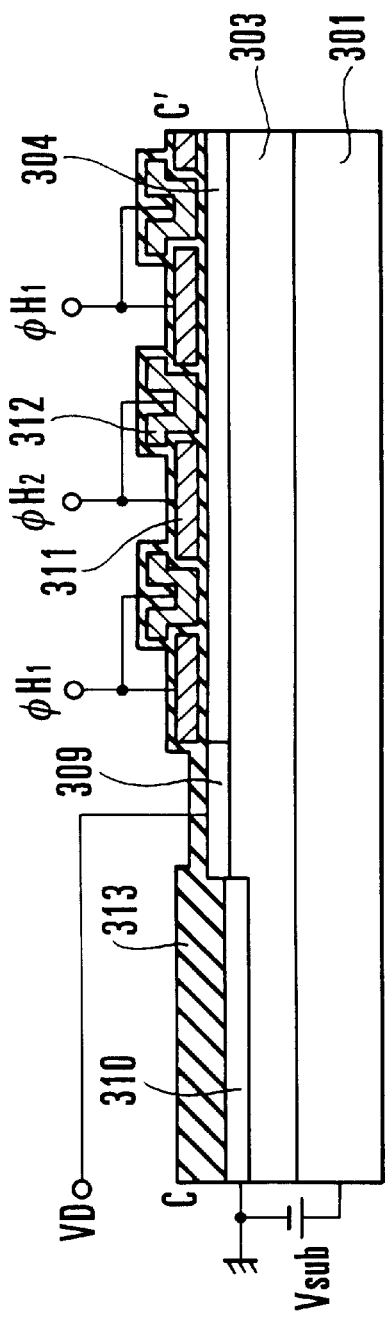
FIGS. 18A and 18B are a sectional view taken along the line C–C' in FIG. 1, and a graph of the potential in the sixth embodiment of the present invention, respectively.
Figure 18B:
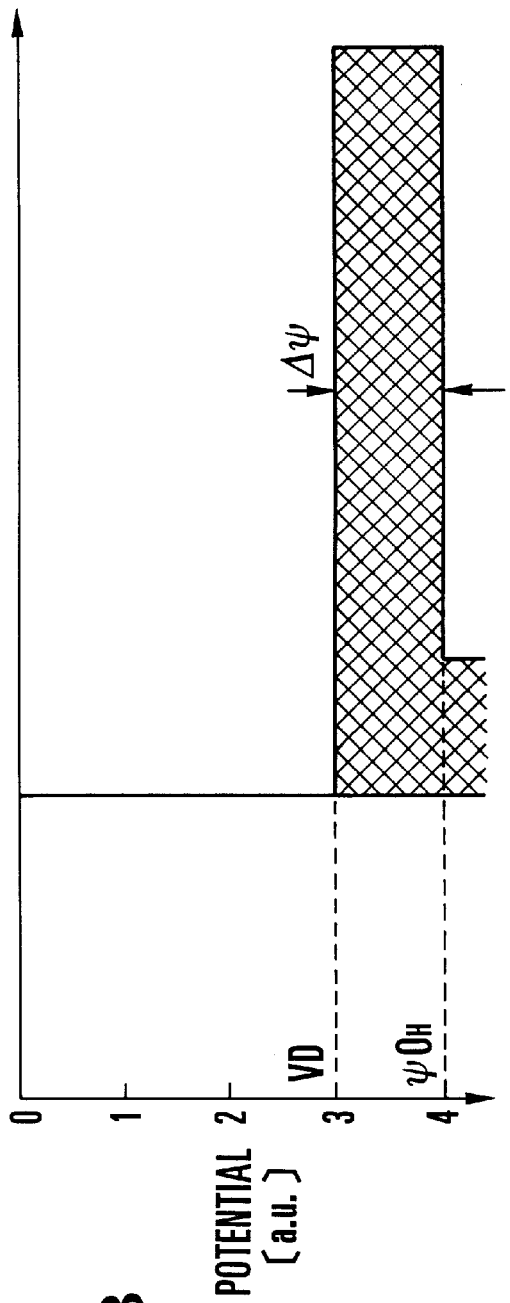
Figure 19:
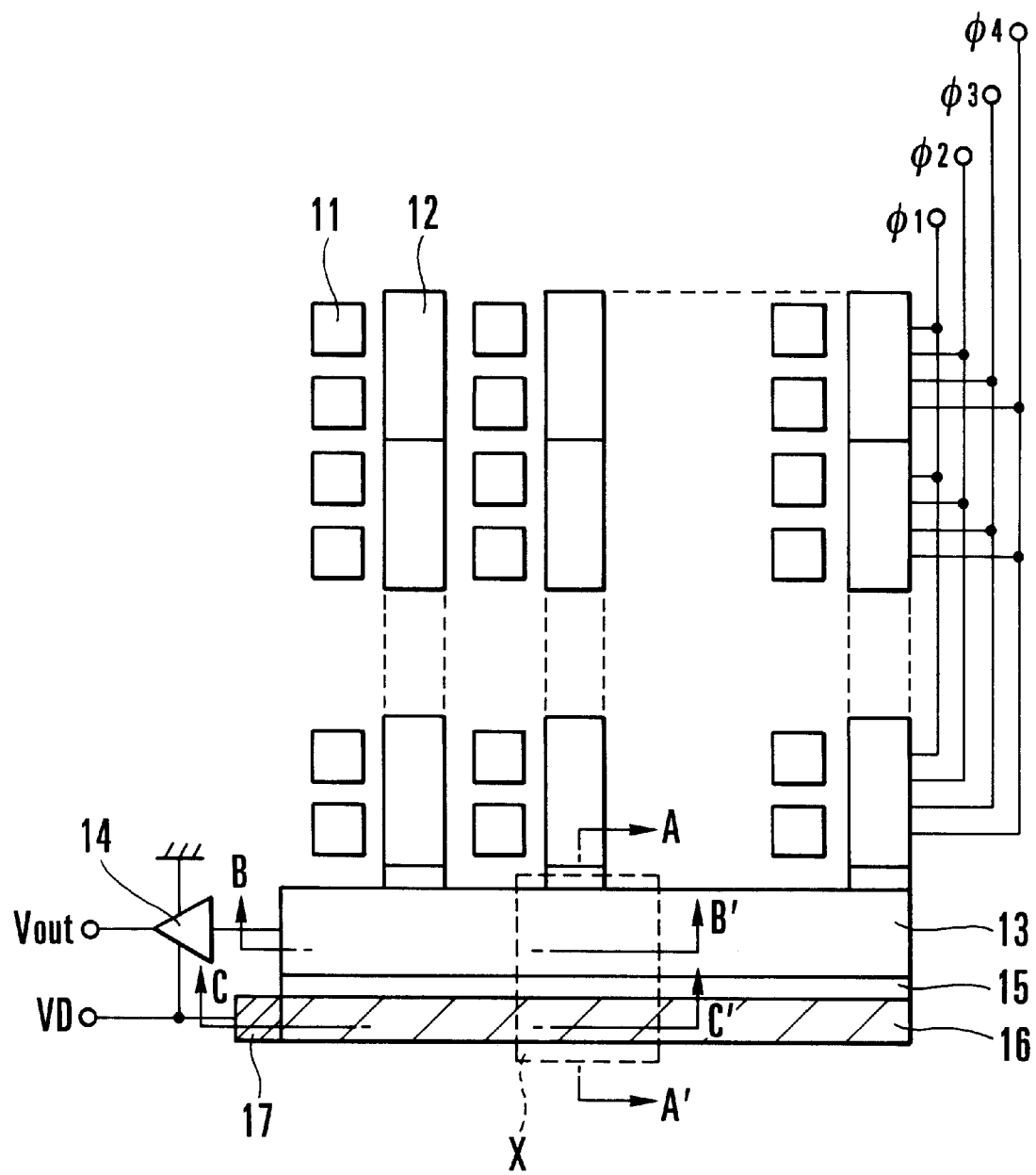
FIG. 19 is a view of the schematic arrangement of a conventional solid-state image sensing device having a charge removing portion adjacent to a horizontal charge transfer portion.
Figure 20:
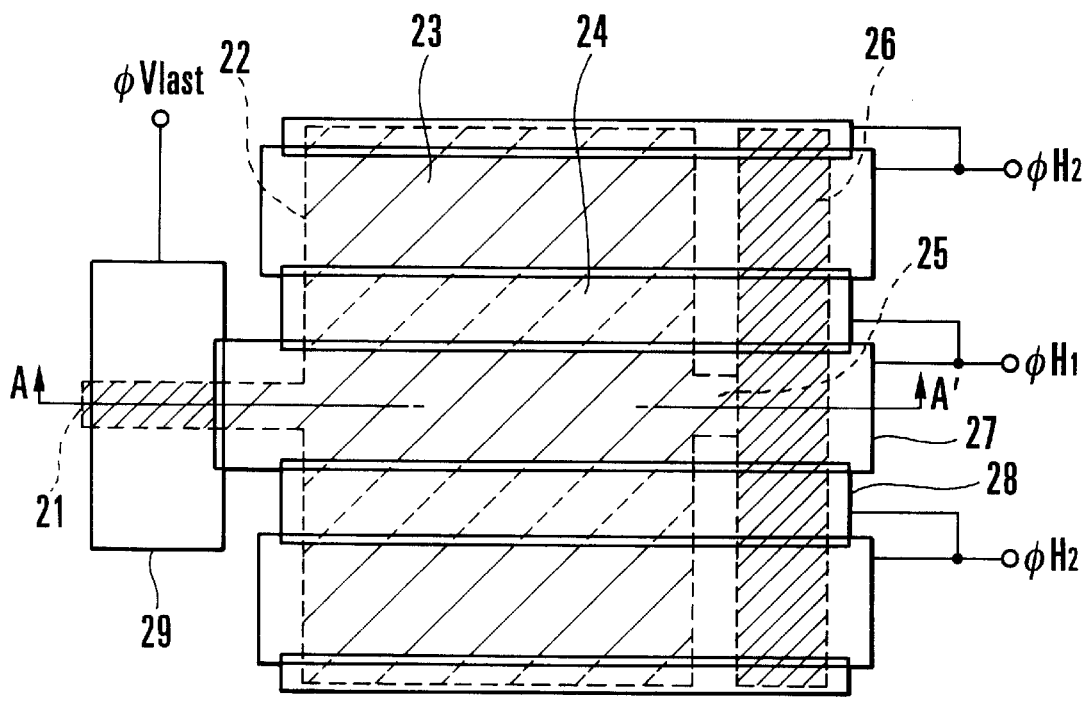
FIG. 20 is an enlarged plan view of the main part of the conventional solid-state image sensing device shown in FIG. 19.
Figures 21A, 21B:
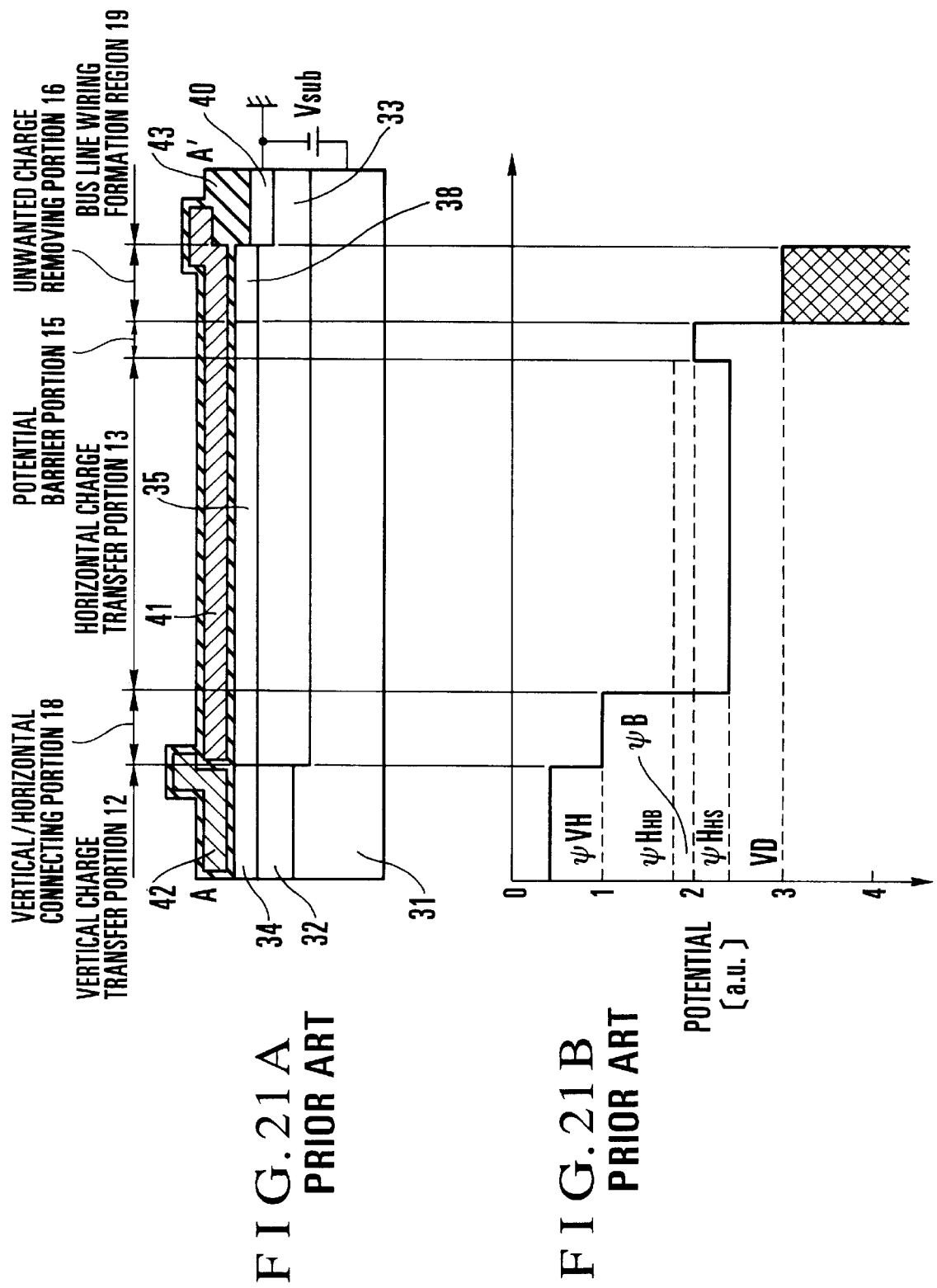
FIGS. 21A and 21B are a sectional view taken along the line A–A' in FIGS. 19 and 20, and a graph of the potential, respectively.

FIGS. 18A and 18B respectively show the section, taken along the line C–C' in FIG. 1, and potential of a solid-state image sensing device according to the sixth embodiment of the present invention. FIG. 10 shows a clock pulse applied to a horizontal charge transfer portion 103 of the solid-state image sensing device according to the sixth embodiment. The sixth embodiment is also an improvement of the fourth embodiment.

In the sixth embodiment, when unwanted charges present at a vertical charge transfer portion 102 are transferred to the horizontal charge transfer portion 103, the clock pulses $\phi H_1$ and $\phi H_2$ applied to horizontal charge transfer electrodes 207 and 208 are kept at the high-level voltage $V_H$, as shown in FIG. 10.

For this reason, in the sixth embodiment, the solid-state image sensing device can operate similarly to the solid-state image sensing device of the fourth embodiment. In addition, since only the potential $V_H$ is applied to the charge transfer electrodes 207 and 208, the difference $\Delta\psi$ ($V_D-\psi O_H$) between the potential of an unwanted charge removing portion 106 (206) formed below the charge transfer electrodes 207 and 208, and the voltage $V_D$ can widen to set the setting margin of the constant voltage $V_D$ wider than that in the fourth embodiment.

In the above-described embodiments of the present invention, the potential barrier of the potential barrier portion 105 (205) is formed by the narrow channel effect of the charge transfer channel. Instead, an impurity of an opposite conductivity type may be doped in an n-type semiconductor region constituting a buried channel to form an n⁻-type semiconductor region, thereby forming the potential barrier portion 105 (205). It is also possible to arrange a dedicated electrode, and apply a desired potential to this electrode, thereby forming the potential barrier portion 105 (205).

In the above-mentioned embodiments, the n++-type semiconductor region applied with the constant voltage $V_D$ is arranged at only one end of the unwanted charge removing portion 106 (206). However, it is also possible to arrange n⁺⁺-type semiconductor regions at two ends of the unwanted charge removing portion 106 (206), and apply a voltage from the two ends. With this structure, unwanted charges can be removed more rapidly.

The above embodiments have exemplified the case wherein the present invention is applied to a buried, two-phase-driving charge transfer device. However, the present invention can be similarly applied to a surface charge transfer device or a three- or four-phase-driving charge transfer device.

As has been described above, in the solid-state image sensing device according to the present invention, n-type semiconductor regions constituting at least a vertical charge transfer portion and an unwanted charge removing portion are formed by the same impurity doping step. Therefore, the solid-state image sensing device provided with the unwanted charge removing portion can be manufactured by a smaller number of manufacturing steps than that in the prior art, reducing the manufacturing cost of the product.

Since no n⁺-type semiconductor region serving as the unwanted charge removing portion with a relatively high impurity concentration need not be formed below a horizontal charge transfer electrode, no abnormal diffusion layer is formed in a channel region or a potential barrier portion owing to outward diffusion of an impurity from the n⁺-type semiconductor region in forming a gate insulating film below the horizontal charge transfer electrode in the subsequent step. Accordingly, the drawback of the conventional solid-state image sensing device that the potential varies due to formation of the abnormal diffusion layer can be solved.

According to the embodiments in which the unwanted charge removing portion is offset from the potential barrier portion, and a region generated by this offset is constituted like the horizontal charge transfer portion, even if the unwanted charge removing portion offsets to the potential barrier portion side owing to a processing variation such as an alignment offset of an n-type semiconductor region or p-well layer, the potential barrier portion and the unwanted charge removing portion do not overlap each other, and the potential of the potential barrier portion can be stabilized.

According to the embodiments in which the clock pulses $\phi H_1$ and $\phi H_2$ applied to the horizontal charge transfer electrode are kept at the high-level voltage $V_H$ when unwanted charges present at the vertical charge transfer portion are transferred to the horizontal charge transfer portion, the difference $\Delta\psi$ between the potential $\psi O_H$ of the unwanted charge removing portion formed below the charge transfer electrode applied with the potential $V_H$, and the constant voltage $V_D$ can widen to widen the setting margin of the constant voltage $V_D$.

What is claimed is:

1. A solid-state image sensing device comprising:
a plurality of photoelectric conversion portions two-dimensionally arranged on one major surface of a semiconductor substrate of a first conductivity type;
vertical charge transfer portions respectively arranged adjacent to said photoelectric conversion portions and having a first well layer of a second conductivity type and a first semiconductor region of the first conductivity type formed on said first well layer of the second conductivity type;
a horizontal charge transfer portion arranged adjacent to one end side of said vertical charge transfer portions and having a second well layer of the second conductivity type and a second semiconductor region of the first conductivity type formed on said second well layer of the second conductivity type;
an unwanted charge removing portion arranged adjacent to said horizontal charge transfer portion on a side opposite to said vertical charge transfer portions to remove an unwanted charge overflowing from said horizontal charge transfer portion, said unwanted charge removing portion having a third well layer of the second conductivity type, and a third semiconductor region of the first conductivity type formed on said third well layer of the second conductivity type; and
a potential barrier portion formed between said horizontal charge transfer portion and said unwanted charge removing portion,
wherein said first and third semiconductor regions of the first conductivity type are formed by the same step, having substantially identical impurity concentrations therein, and said second and third well layers of the second conductivity type are formed by the same step.

2. A device according to claim 1, wherein an impurity of the first conductivity type is doped in said first and third semiconductor regions of the first conductivity type at the same time as an impurity diffusion step of said second semiconductor region of the first conductivity type, and an impurity of the first conductivity type is additionally doped in a subsequent step.

3. A device according to claim 1, wherein an impurity of the second conductivity type is doped in said first well layer of the second conductivity type at the same time as an impurity diffusion step of said second and third well layers of the second conductivity type, and an impurity of the second conductivity type is additionally doped in a subsequent step.

4. A device according to claim 1, wherein said unwanted charge removing portion has a channel width of not less than 6 μm.

5. A device according to claim 1, wherein said vertical charge transfer portions, said horizontal charge transfer portion having a diffusion layer arranged at one end to which a predetermined potential is applied, and a channel region of said potential barrier portion are kept in a depleted state, and a channel region of said unwanted charge removing portion is kept in an undepleted state by a potential applied to a diffusion layer arranged at one or two ends.

6. A solid-state image sensing device comprising:

a plurality of photoelectric conversion portions two-dimensionally arranged on one major surface of a semiconductor substrate of a first conductivity type;

vertical charge transfer portions respectively arranged adjacent to said photoelectric conversion portions and having a first well layer of a second conductivity type and a first semiconductor region of the first conductivity type formed on said first well layer of the second conductivity type;

a horizontal charge transfer portion arranged adjacent to one end side of said vertical charge transfer portions and having a second well layer of the second conductivity type and a second semiconductor region of the first conductivity type formed on said second well layer of the second conductivity type;

an unwanted charge removing portion arranged adjacent to said horizontal charge transfer portion on a side opposite to said vertical charge transfer portions to remove an unwanted charge overflowing from said horizontal charge transfer portion, said unwanted charge removing portion having a third well layer of the second conductivity type, and a third semiconductor region of the first conductivity type formed on said third well layer of the second conductivity type; and a potential barrier portion formed between said horizontal charge transfer portion and said unwanted charge removing portion, wherein said first and third semiconductor regions of the first conductivity type are formed by the same step, and said second and third well layers of the second conductivity type are formed by the same step, said vertical charge transfer portions, said horizontal charge transfer portion having a diffusion layer arranged at one end to which a predetermined potential is applied, and a channel region of said potential barrier portion are kept in a depleted state, a channel region of said unwanted charge removing portion is kept in an undepleted state by a potential applied to a diffusion layer arranged at one or two ends, and wherein the potential applied to said diffusion layer arranged at one or two ends of said unwanted charge removing portion is shallower by not less than 0.5 V than a potential when said unwanted charge removing portion is in a depleted state.

7. A device according to claim 1, wherein, when a high-level voltage is applied to a horizontal charge transfer electrode of said horizontal charge transfer portion, said vertical charge transfer portions, said horizontal charge transfer portion having a diffusion layer arranged at one end to which a predetermined potential is applied, and a channel region of said potential barrier portion are kept in a depleted state, and a channel region of said unwanted charge removing portion is kept in an undepleted state by a potential applied to a diffusion layer arranged at one or two ends.

8. A solid-state image sensing device comprising:

a plurality of photoelectric conversion portions two-dimensionally arranged on one major surface of a semiconductor substrate of a first conductivity type;

vertical charge transfer portions respectively arranged adjacent to said photoelectric conversion portions and having a first well layer of a second conductivity type and a first semiconductor region of the first conductivity type formed on said first well layer of the second conductivity type;

a horizontal charge transfer portion arranged adjacent to one end side of said vertical charge transfer portions and having a second well layer of the second conductivity type and a second semiconductor region of the first conductivity type formed on said second well layer of the second conductivity type;

an unwanted charge removing portion arranged adjacent to said horizontal charge transfer portion on a side opposite to said vertical charge transfer portions to remove an unwanted charge overflowing from said horizontal charge transfer portion, said unwanted charge removing portion having a third well layer of the second conductivity type, and a third semiconductor region of the first conductivity type formed on said third well layer of the second conductivity type; and a potential barrier portion formed between said horizontal charge transfer portion and said unwanted charge removing portion, wherein said first and third semiconductor regions of the first conductivity type are formed by the same step, and said second and third well layers of the second conductivity type are formed by the same step, wherein, when a high-level voltage is applied to a horizontal charge transfer electrode of said horizontal charge transfer portion, said vertical charge transfer portions, said horizontal charge transfer portion having a diffusion layer arranged at one end to which a predetermined potential is applied, and a channel region of said potential barrier portion are kept in a depleted state, a channel region of said unwanted charge removing portion is kept in an undepleted state by a potential applied to a diffusion layer arranged at one or two ends, and wherein the potential applied to said diffusion layer arranged at one or two ends of said unwanted charge removing portion is shallower by not less than 0.5 V than a potential when said unwanted charge removing portion is in a depleted state.

9. A solid-state image sensing device comprising:
a plurality of photoelectric conversion portions two-dimensionally arranged on one major surface of a semiconductor substrate of a first conductivity type;
vertical charge transfer portions respectively arranged adjacent to said photoelectric conversion portions and having a first well layer of a second conductivity type and a first semiconductor region of the first conductivity type formed on said first well layer of the second conductivity type;
a horizontal charge transfer portion arranged adjacent to one end side of said vertical charge transfer portions and having a second well layer of the second conductivity type and a second semiconductor region of the first conductivity type formed on said second well layer of the second conductivity type;
an unwanted charge removing portion arranged adjacent to said horizontal charge transfer portion on a side opposite to said vertical charge transfer portions to remove an unwanted charge overflowing from said horizontal charge transfer portion, said unwanted charge removing portion having a third well layer of the second conductivity type, and a third semiconductor region of the first conductivity type formed on said third well layer of the second conductivity type; and
a potential barrier portion formed between said horizontal charge transfer portion and said unwanted charge removing portion,
wherein said first, second, and third semiconductor regions of the first conductivity type are formed by the same step, and said second well layer of the second conductivity type is formed by doping an impurity at the same time as an impurity diffusion step of forming said first and third well layers of the second conductivity type.

10. A device according to claim 9, wherein at least one of said third semiconductor region of the first conductivity type and said third well layer of the second conductivity type which constitute said unwanted charge removing portion is formed to retreat from said potential barrier portion, and a region generated by retreat constitutes one of said second semiconductor region of the first conductivity type and said second well layer of the second conductivity type which constitute said horizontal charge transfer portion.

11. A device according to claim 9, wherein said unwanted charge removing portion is formed to retreat from said potential barrier portion by not less than 1 $\mu$m.

12. A device according to claim 9, wherein said unwanted charge removing portion has a channel width of not less than 6 $\mu$m.

13. A device according to claim 9, wherein said vertical charge transfer portions, said horizontal charge transfer portion having a diffusion layer arranged at one end to which a predetermined potential is applied, and a channel region of said potential barrier portion are kept in a depleted state, and charge transfer portion having a diffusion layer arranged at one end to which a predetermined potential is applied, and a channel region of said potential barrier portion are kept in a depleted state, and
a channel region of said unwanted charge removing portion is kept an undepleted state by a potential applied to a diffusion layer arranged at one or two ends.

14. A device according to claim 13, wherein the potential applied to said diffusion layer arranged at one or two ends of said unwanted charge removing portion is shallower by not less than 0.5 V than a potential when said unwanted charge removing portion is in a depleted state.

15. A device according to claim 9, wherein, when a high-level voltage is applied to a horizontal charge transfer electrode of said horizontal charge transfer portion, said vertical charge transfer portions, said horizontal charge transfer portion having a diffusion layer arranged at one end to which a predetermined potential is applied, and a channel region of said potential barrier portion are kept in a depleted state, and
a channel region of said unwanted charge removing portion is kept in a non-depletion state by a potential applied to a diffusion layer arranged at one or two ends.

16. A device according to claim 15, wherein the potential applied to said diffusion layer arranged at one or two ends of said unwanted charge removing portion is shallower by not less than 0.5 v than a potential when said unwanted charge removing portion is in a depleted state.

17. A solid-state image sensing device comprising:
a plurality of photoelectric conversion portions two-dimensionally arranged on one major surface of a semiconductor substrate of a first conductivity type;
vertical charge transfer portions respectively arranged adjacent to said photoelectric conversion portions and having a first well layer of a second conductivity type and a first semiconductor region of the first conductivity type formed on said first well layer of the second conductivity type;
a horizontal charge transfer portion arranged adjacent to one end side of said vertical charge transfer portions and having a second well layer of the second conductivity type and a second semiconductor region of the first conductivity type formed on said second well layer of the second conductivity type;
an unwanted charge removing portion arranged adjacent to said horizontal charge transfer portion on a side opposite to said vertical charge transfer portions to remove an unwanted charge overflowing from said horizontal charge transfer portion, said unwanted charge removing portion having a third well layer of the second conductivity type, and a third semiconductor region of the first conductivity type, having a substantially identical impurity concentration to said second semiconductor region of the first conductivity type, formed on said third well layer of the second conductivity type; and
a potential barrier portion formed between said horizontal charge transfer portion and said unwanted charge removing portion.

18. A device according to claim 17, wherein said unwanted charge removing portion has a channel width of not less than 6 $\mu$m.

19. A device according to claim 17, wherein said vertical charge transfer portions, said horizontal charge transfer portion having a diffusion layer arranged at one end to which a predetermined potential is applied, and a channel region of said potential barrier portion are kept in a depleted state, and
a channel region of said unwanted charge removing portion is kept in an undepleted state by a potential applied to a diffusion layer arranged at one or two ends.

20. A device according to claim 19, wherein the potential applied to said diffusion layer arranged at one or two ends of said unwanted charge removing portion is shallower by not less than 0.5 V than a potential when said unwanted charge removing portion is in a depleted state.

21. A device according to claim 17, wherein, when a high-level voltage is applied to a horizontal charge transfer electrode of said horizontal charge transfer portion, said vertical charge transfer portions, said horizontal charge transfer portion having a diffusion layer arranged at one end to which a predetermined potential is applied, and a channel region of said potential barrier portion are kept in a depleted state, and a channel region of said unwanted charge removing portion is kept in an undepleted state by a potential applied to a diffusion layer arranged at one or two ends.

22. A device according to claim 21, wherein the potential applied to said diffusion layer arranged at one or two ends of said unwanted charge removing portion is shallower by not less than 0.5 V than a potential when said unwanted charge removing portion is in a depleted state.

* * * * *